ically, the field of the invention relates to a display device and an electronic device using a semiconductor device for its display part.

(12) United States Patent
Yamazaki

(10) Patent No.: US 7,323,715 B2
(45) Date of Patent: *Jan. 29, 2008

(54) SEMICONDUCTOR DEVICE AND MANUFACTURING METHOD THEREOF

(75) Inventor: Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/514,274

(22) Filed: Sep. 1, 2006

(65) Prior Publication Data

US 2007/0001171 A1    Jan. 4, 2007

Related U.S. Application Data

(62) Division of application No. 11/132,276, filed on May 19, 2005, now Pat. No. 7,102,165, which is a division of application No. 09/566,733, filed on May 9, 2000, now Pat. No. 6,900,084.

(30) Foreign Application Priority Data

May 9, 2000    (JP) .............................. 2000-135602

(51) Int. Cl.
*H01L 29/04* (2006.01)
*H01L 29/10* (2006.01)

(52) U.S. Cl. .................. 257/59; 438/149; 438/158
(58) Field of Classification Search ............ 257/59; 438/149, 158, 159; 349/46
See application file for complete search history.

(56) References Cited

U.S. PATENT DOCUMENTS

| 4,624,737 A | 11/1986 | Shimbo |
| 4,960,719 A | 10/1990 | Tanaka et al. |
| 5,028,551 A | 7/1991 | Dohjo et al. |
| 5,084,961 A | 2/1992 | Yoshikawa |
| 5,151,806 A | 9/1992 | Kawamoto et al. |
| 5,261,156 A | 11/1993 | Mase et al. |

(Continued)

FOREIGN PATENT DOCUMENTS

JP    05-323371    12/1993

(Continued)

OTHER PUBLICATIONS

Specification, claims, abstract and drawings of U.S. Appl. No. 09/635,945, filed Aug. 10, 2000.

(Continued)

*Primary Examiner*—Fernando L. Toledo
(74) *Attorney, Agent, or Firm*—Eric J. Robinson; Robinson Intellectual Property Law Office, P.C.

(57)    ABSTRACT

A means of forming unevenness for preventing specular reflection of a pixel electrode, without increasing the number of process steps, is provided. In a method of manufacturing a reflecting type liquid crystal display device, the formation of unevenness (having a radius of curvature r in a convex portion) in the surface of a pixel electrode is performed by the same photomask as that used for forming a channel etch type TFT, in which the convex portion is formed in order to provide unevenness to the surface of the pixel electrode and give light scattering characteristics.

27 Claims, 17 Drawing Sheets

U.S. PATENT DOCUMENTS

| | | |
|---|---|---|
| 5,362,660 A | 11/1994 | Kwasnick et al. |
| 5,478,766 A | 12/1995 | Park et al. |
| 5,532,180 A | 7/1996 | den Boer et al. |
| 5,539,219 A | 7/1996 | den Boer et al. |
| 5,583,675 A | 12/1996 | Yamada et al. |
| 5,668,379 A | 9/1997 | Ono et al. |
| 5,668,651 A | 9/1997 | Yamada et al. |
| 5,706,064 A | 1/1998 | Fukunaga et al. |
| 5,739,880 A | 4/1998 | Suzuki et al. |
| 5,757,453 A | 5/1998 | Shin et al. |
| 5,757,456 A | 5/1998 | Yamazaki et al. |
| 5,766,977 A | 6/1998 | Yamazaki |
| 5,798,812 A | 8/1998 | Nishiki et al. |
| 5,811,318 A | 9/1998 | Kweon |
| 5,821,138 A | 10/1998 | Yamazaki et al. |
| 5,825,449 A | 10/1998 | Shin |
| 5,834,327 A | 11/1998 | Yamazaki et al. |
| 5,847,687 A | 12/1998 | Hirakata et al. |
| 5,867,233 A | 2/1999 | Tanaka |
| 5,892,562 A | 4/1999 | Yamazaki et al. |
| 5,917,564 A | 6/1999 | Kim et al. |
| 5,917,567 A | 6/1999 | Oh et al. |
| 5,940,154 A | 8/1999 | Ukita et al. |
| 5,942,767 A | 8/1999 | Na et al. |
| 5,959,599 A | 9/1999 | Hirakata |
| 5,966,189 A | 10/1999 | Matsuo |
| 5,977,562 A | 11/1999 | Hirakata et al. |
| 5,986,724 A | 11/1999 | Akiyama et al. |
| 5,990,998 A | 11/1999 | Park et al. |
| 5,994,721 A | 11/1999 | Zhong et al. |
| 5,995,190 A | 11/1999 | Nagae et al. |
| 5,998,229 A | 12/1999 | Lyu et al. |
| 6,008,869 A | 12/1999 | Oana et al. |
| 6,025,892 A | 2/2000 | Kawai et al. |
| 6,055,028 A | 4/2000 | Nishi et al. |
| 6,061,112 A | 5/2000 | Ukita et al. |
| 6,064,456 A | 5/2000 | Taniguchi et al. |
| 6,072,557 A | 6/2000 | Kishimoto |
| 6,075,257 A | 6/2000 | Song |
| 6,097,458 A | 8/2000 | Tsuda et al. |
| 6,097,459 A | 8/2000 | Shimada et al. |
| 6,097,465 A | 8/2000 | Hiroki et al. |
| 6,114,184 A | 9/2000 | Matsumoto et al. |
| 6,118,502 A | 9/2000 | Yamazaki et al. |
| 6,124,606 A | 9/2000 | den Boer et al. |
| 6,130,729 A | 10/2000 | Oh et al. |
| 6,153,893 A | 11/2000 | Inoue et al. |
| 6,160,600 A | 12/2000 | Yamazaki et al. |
| 6,184,946 B1 | 2/2001 | Ando et al. |
| 6,188,452 B1 | 2/2001 | Kim et al. |
| 6,190,933 B1 | 2/2001 | Shimabukuro et al. |
| 6,197,625 B1 | 3/2001 | Choi |
| 6,208,390 B1 | 3/2001 | Ejiri et al. |
| 6,208,395 B1 | 3/2001 | Kanoh et al. |
| 6,218,221 B1 | 4/2001 | Sah |
| 6,255,668 B1 | 7/2001 | Kang et al. |
| 6,266,117 B1 | 7/2001 | Yanagawa et al. |
| 6,266,121 B1 | 7/2001 | Shigeta et al. |
| 6,271,903 B1 | 8/2001 | Shin et al. |
| 6,304,243 B1 | 10/2001 | Kondo et al. |
| 6,317,187 B1 | 11/2001 | Nakajima et al. |
| 6,323,051 B1 | 11/2001 | Shimada |
| 6,331,881 B1 | 12/2001 | Hatano et al. |
| 6,339,462 B1 | 1/2002 | Kishimoto et al. |
| 6,341,002 B1 * | 1/2002 | Shimizu et al. ............ 349/119 |
| 6,359,672 B2 | 3/2002 | Gu et al. |
| 6,387,737 B1 | 5/2002 | Yamazaki et al. |
| 6,583,065 B1 | 6/2003 | Williams et al. |
| 6,624,864 B1 | 9/2003 | Kubo et al. |
| 6,671,025 B1 | 12/2003 | Ikeda et al. |
| 6,709,901 B1 | 3/2004 | Yamazaki et al. |
| 6,747,288 B2 | 6/2004 | Yamazaki et al. |
| 6,806,495 B1 | 10/2004 | Yamazaki et al. |
| 6,855,957 B1 | 2/2005 | Yamazaki et al. |
| 7,102,165 B2 * | 9/2006 | Yamazaki .................... 257/59 |
| 7,102,718 B1 | 9/2006 | Yamazaki et al. |
| 2002/0145602 A1 | 10/2002 | Matsueda |
| 2002/0171085 A1 | 11/2002 | Suzawa et al. |
| 2003/0058210 A1 | 3/2003 | Yamazaki et al. |

FOREIGN PATENT DOCUMENTS

| | | |
|---|---|---|
| JP | 07-014880 | 1/1995 |
| JP | 09-015621 | 1/1997 |
| JP | 09-054318 | 2/1997 |
| JP | 09-152626 | 6/1997 |
| JP | 11-109372 | 4/1999 |
| JP | 11-160734 | 6/1999 |
| JP | 11-202368 | 7/1999 |
| JP | 11-258596 | 9/1999 |
| JP | 2001-085698 | 3/2001 |
| JP | 2001-250953 | 9/2001 |
| JP | 2001-255560 | 9/2001 |
| JP | 2001-257359 | 9/2001 |
| JP | 2001-264804 | 9/2001 |
| JP | 2001-264807 | 9/2001 |
| JP | 2001-318626 | 11/2001 |
| KR | 1998-042096 | 8/1998 |

OTHER PUBLICATIONS

Specification, claims, abstract, and pending claims of U.S. Appl. No. 09/566,742, filed Jul. 7, 2000 to Yamazaki et al.

S. Wolf et al., *Silicon Processing for the VSLI Era*, vol. 1, pp. 171-173, Jan. 1, 1986.

Wolf and Tauber, "Silicon Processing for the VLSI Era Vol. 1: Process Technology," pp. 161-175, 335, Lattice Press, 1986.

Office Action (Application No. 10-2006-0041215; KR4907D1) dated Jun. 27, 2007.

\* cited by examiner

[Fig.1]
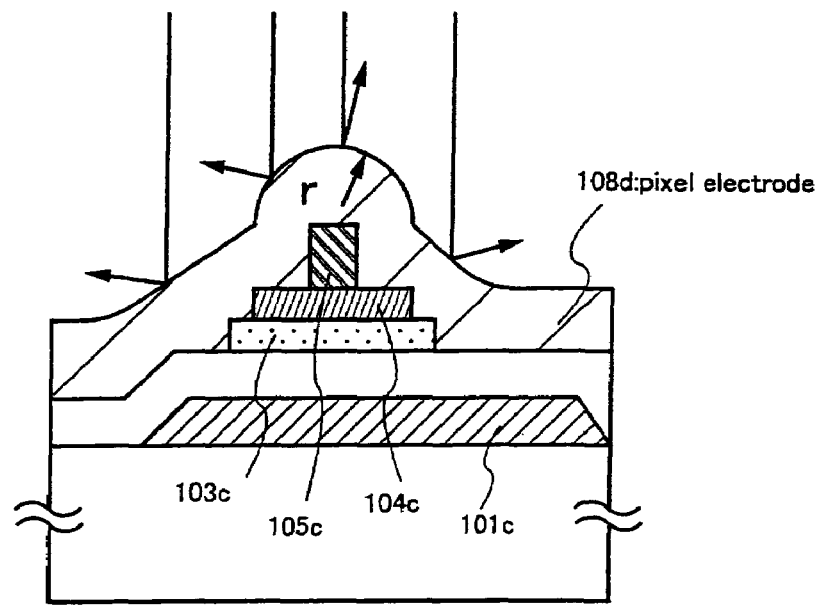
A drawing showing the radius of curvature r of a convex portion in a pixel electrode

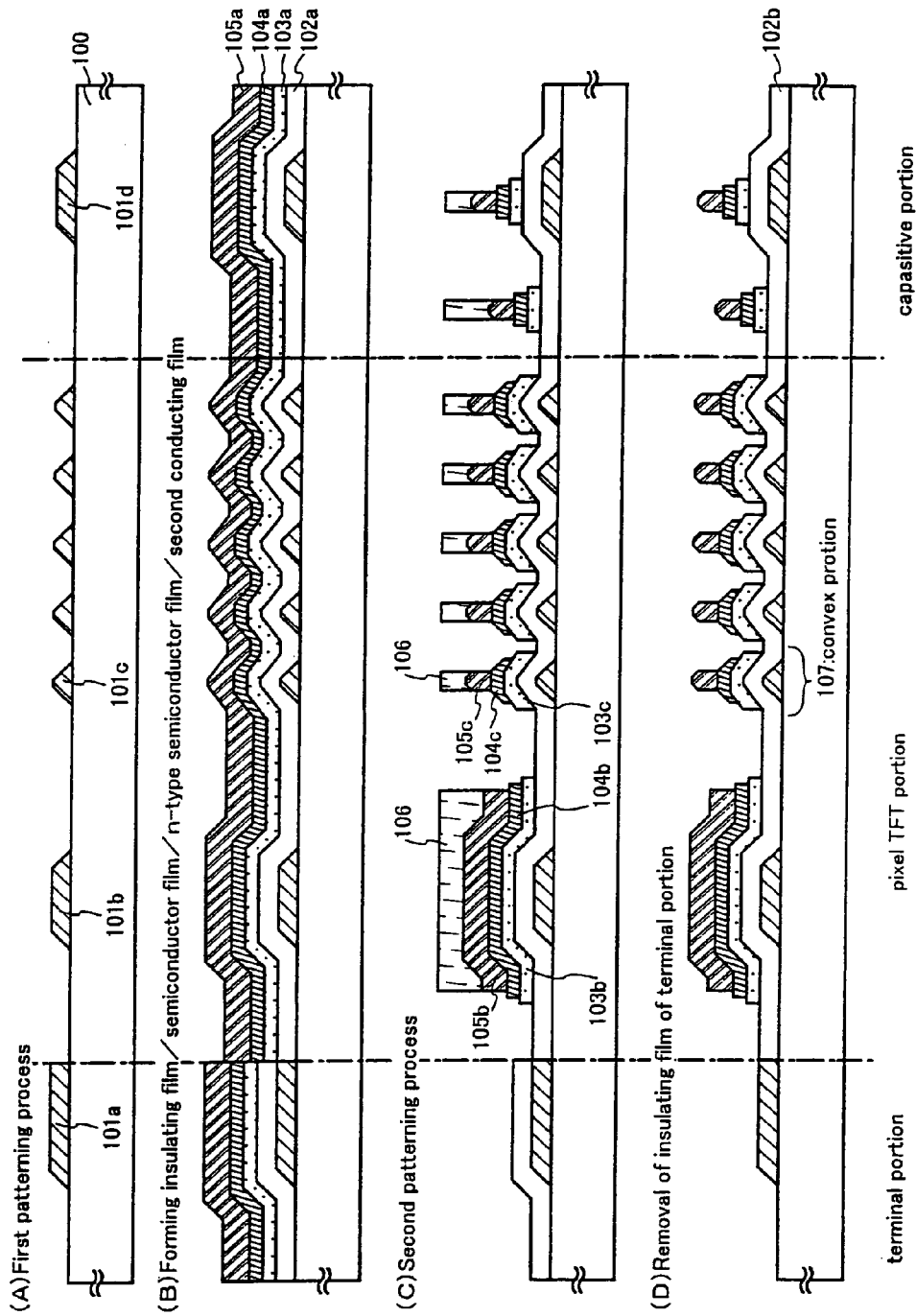

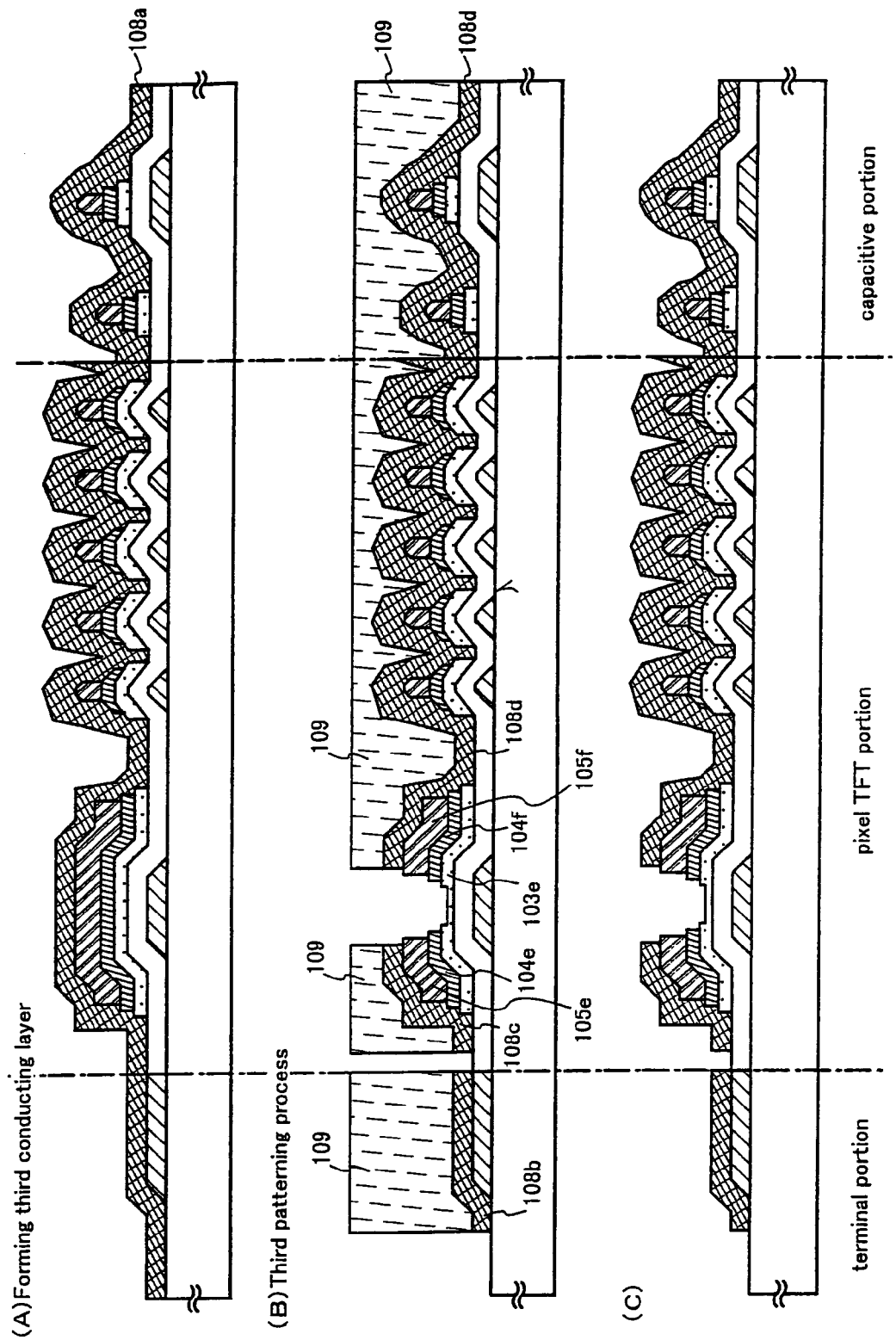

[Fig.4]
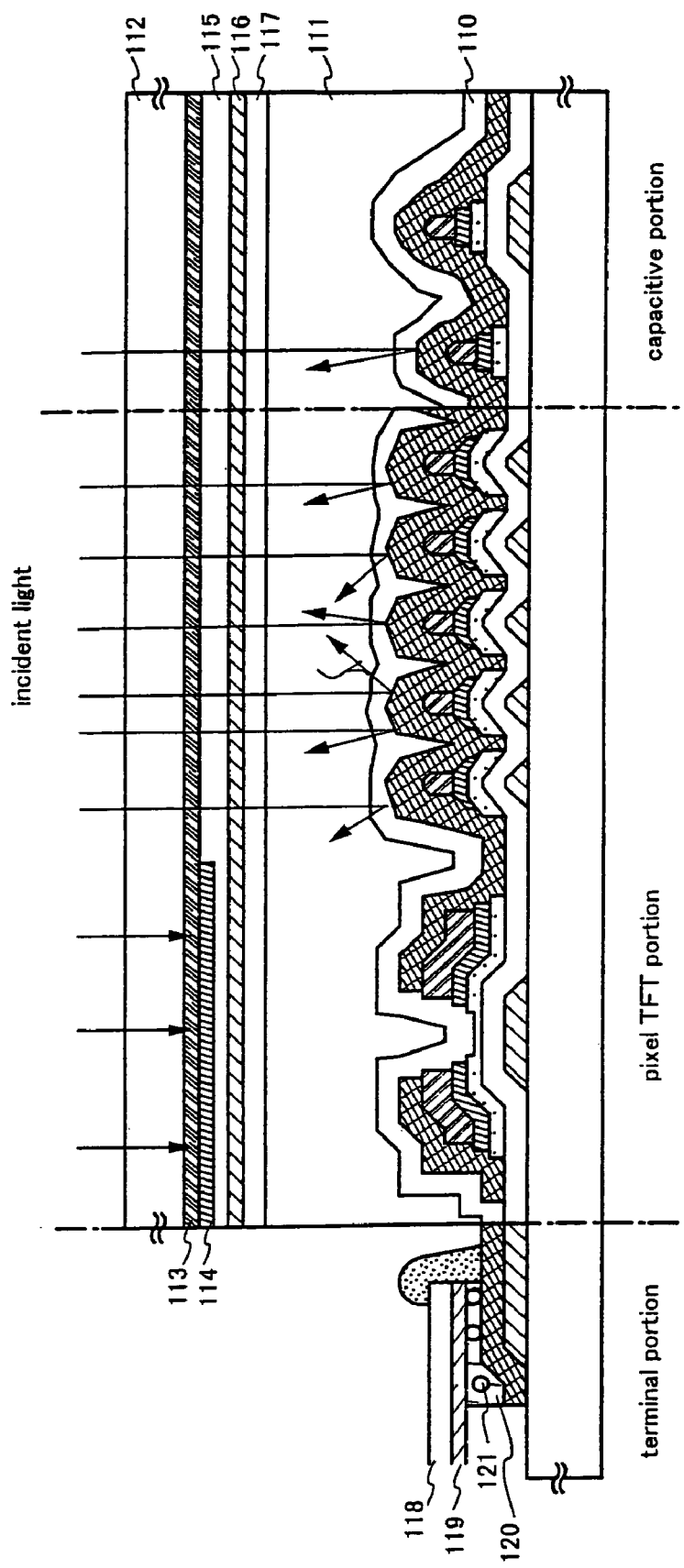

[Fig.5]
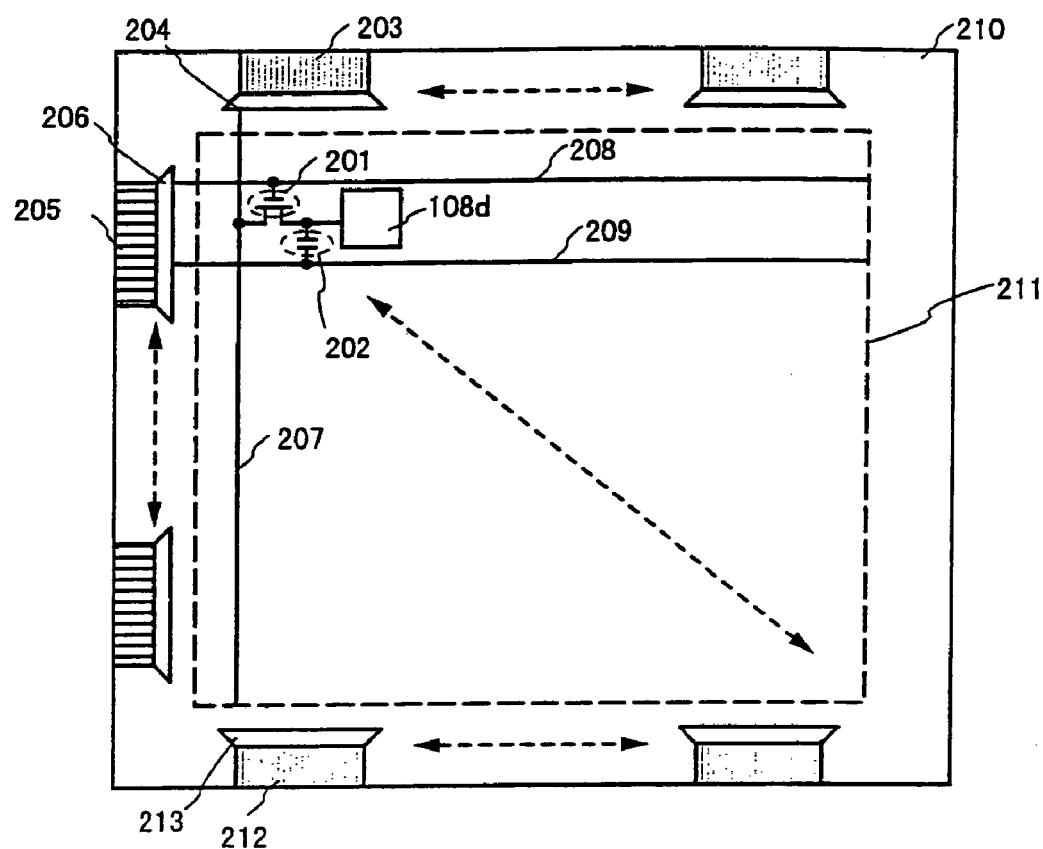

[Fig6]
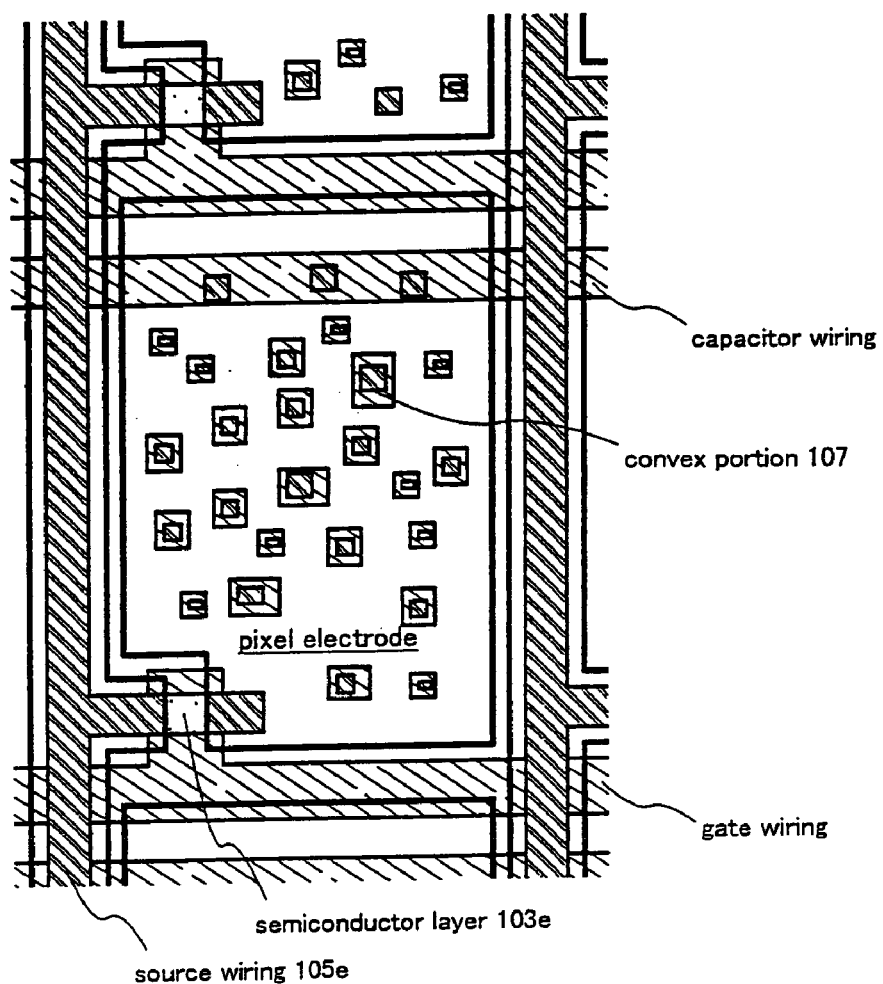

[Fig. 7]
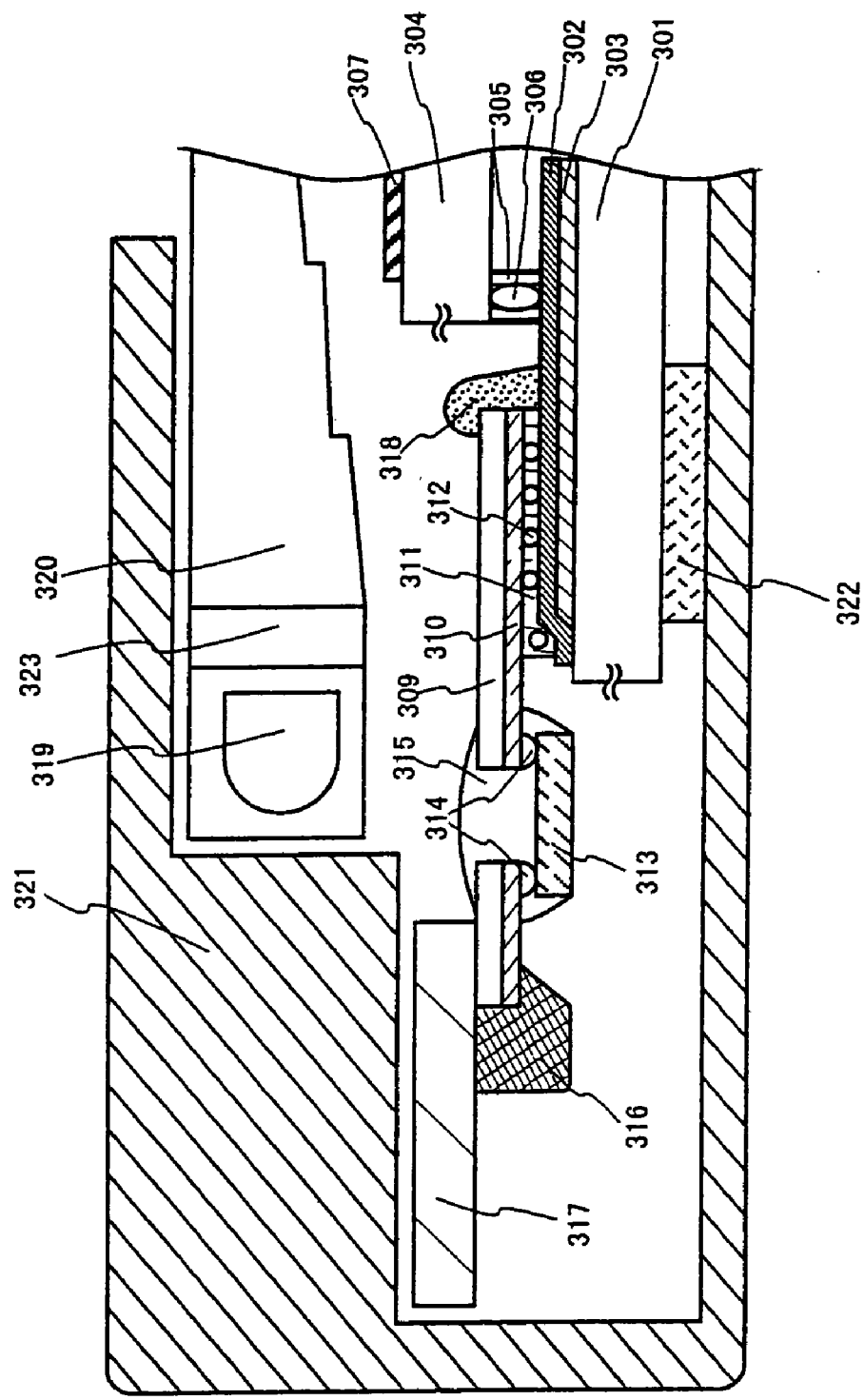

[Fig.8]
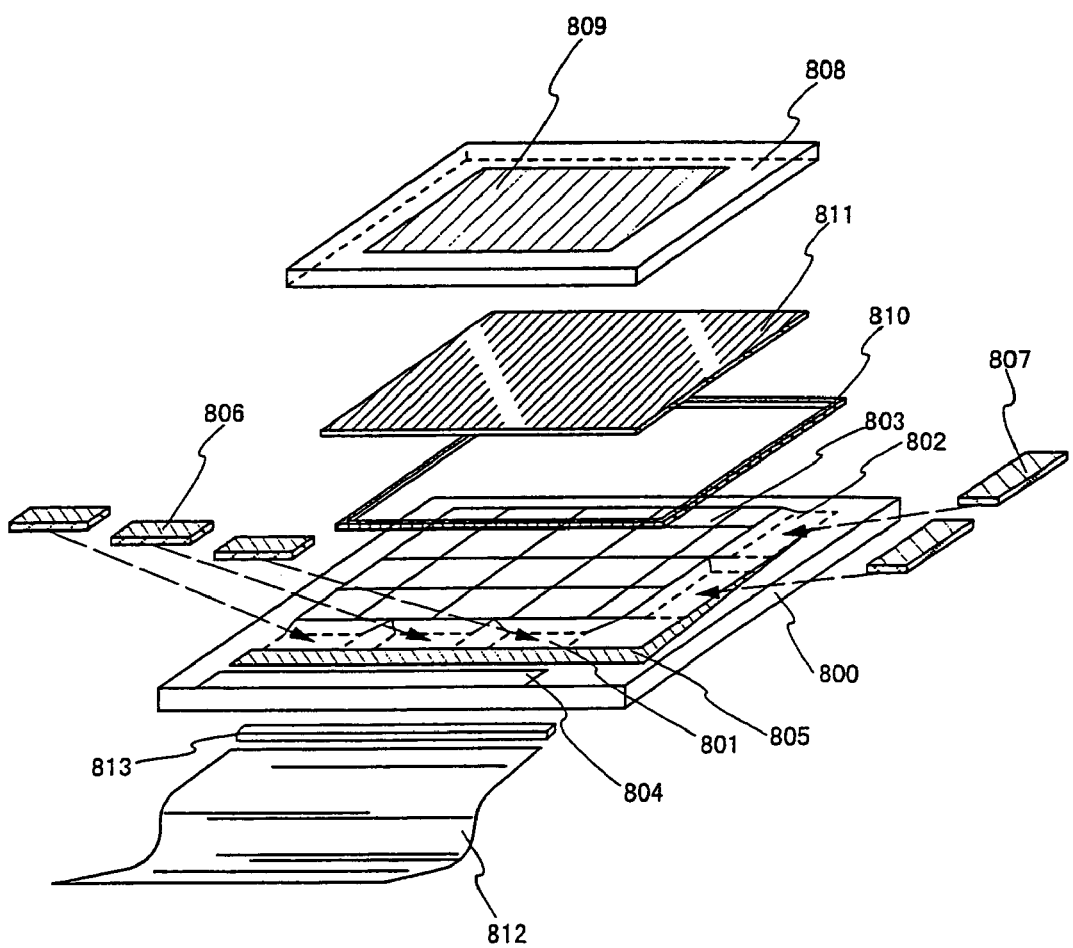
800:first substrate, 801:region for attaching IC chip(data line),
802:region for attaching IC chip(scanning line), 803:pixel region,
804:input terminal, 805:connection wiring, 806, 807:IC chip,
808:second substrate, 809:common electrode, 810:sealing material, 811:liquid crystal,
812:FPC, 813:reinforcing plate

[Fig.9]
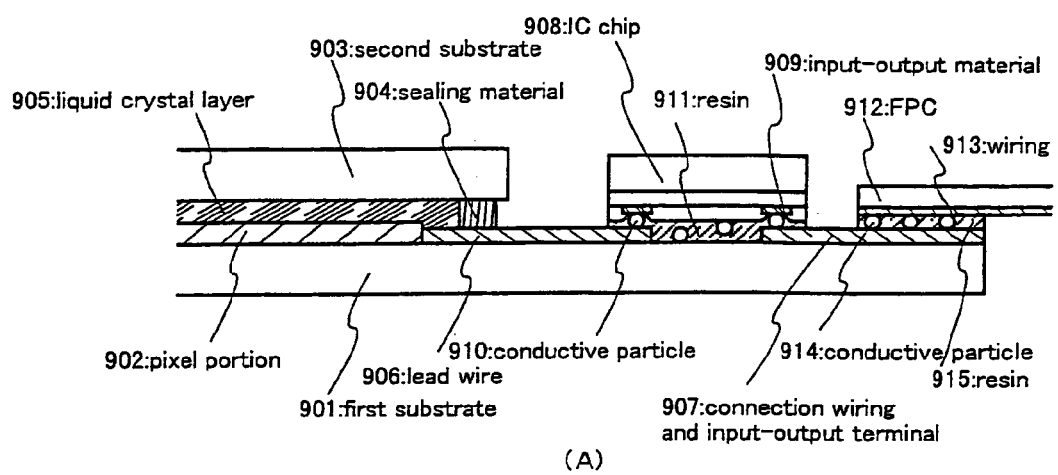
(A)
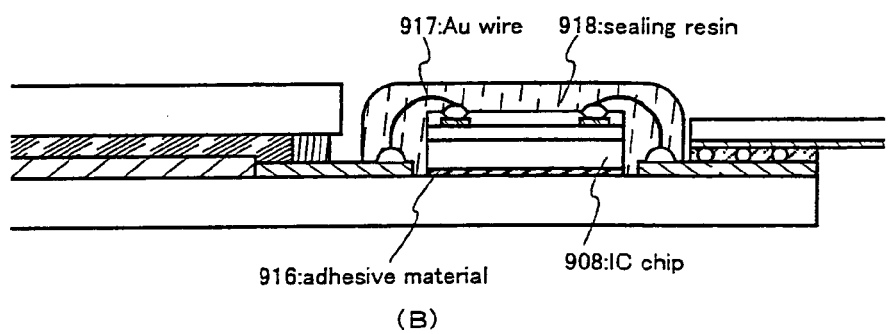
(B)

[Fig. 10]
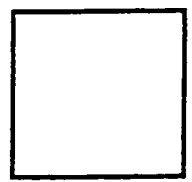
(A)
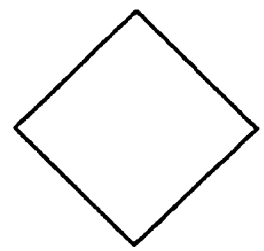
(B)
(C)
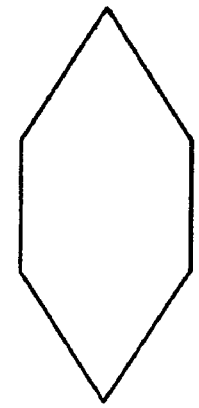
(D)
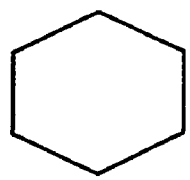
(E)
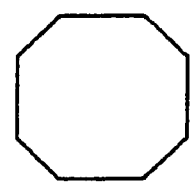
(F)
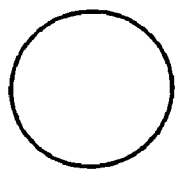
(G)

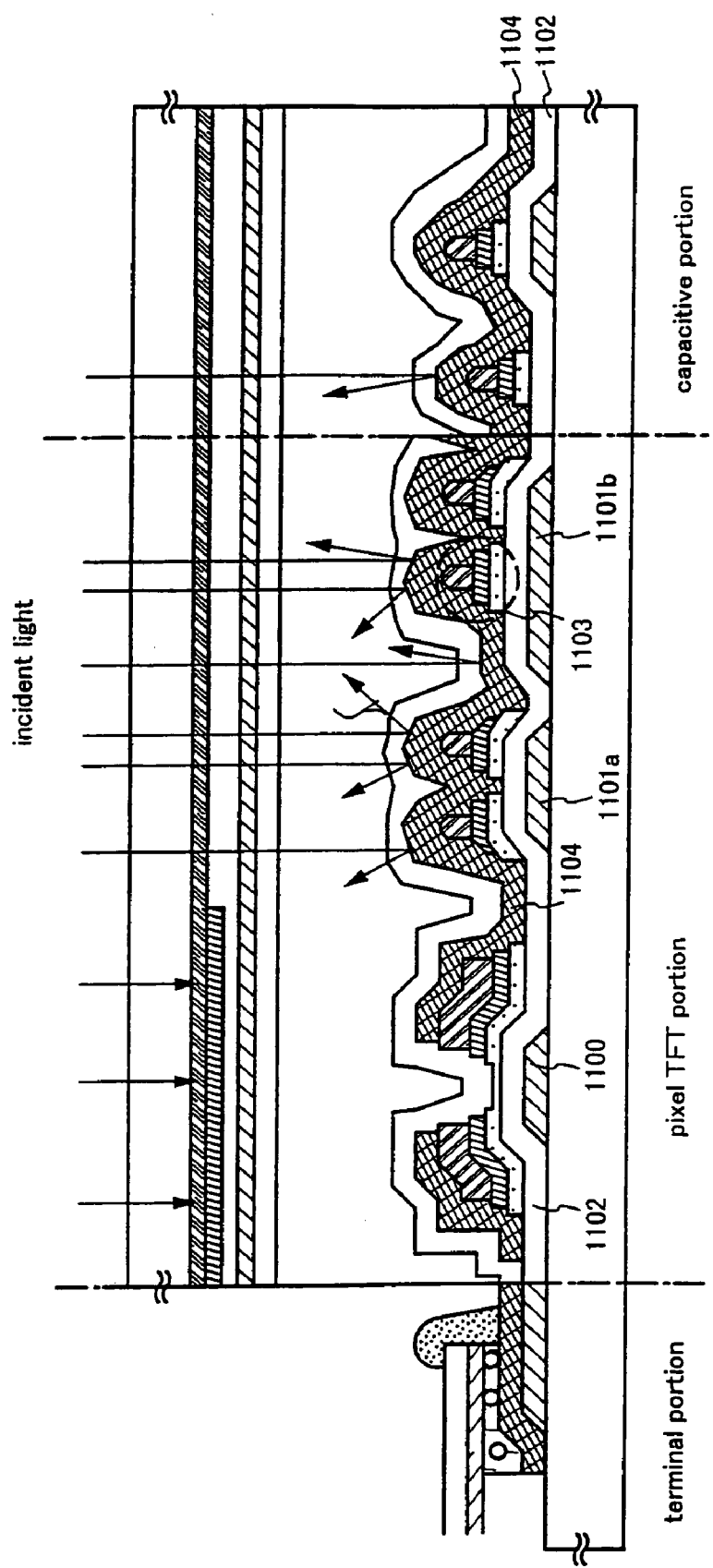
[Fig. 11]

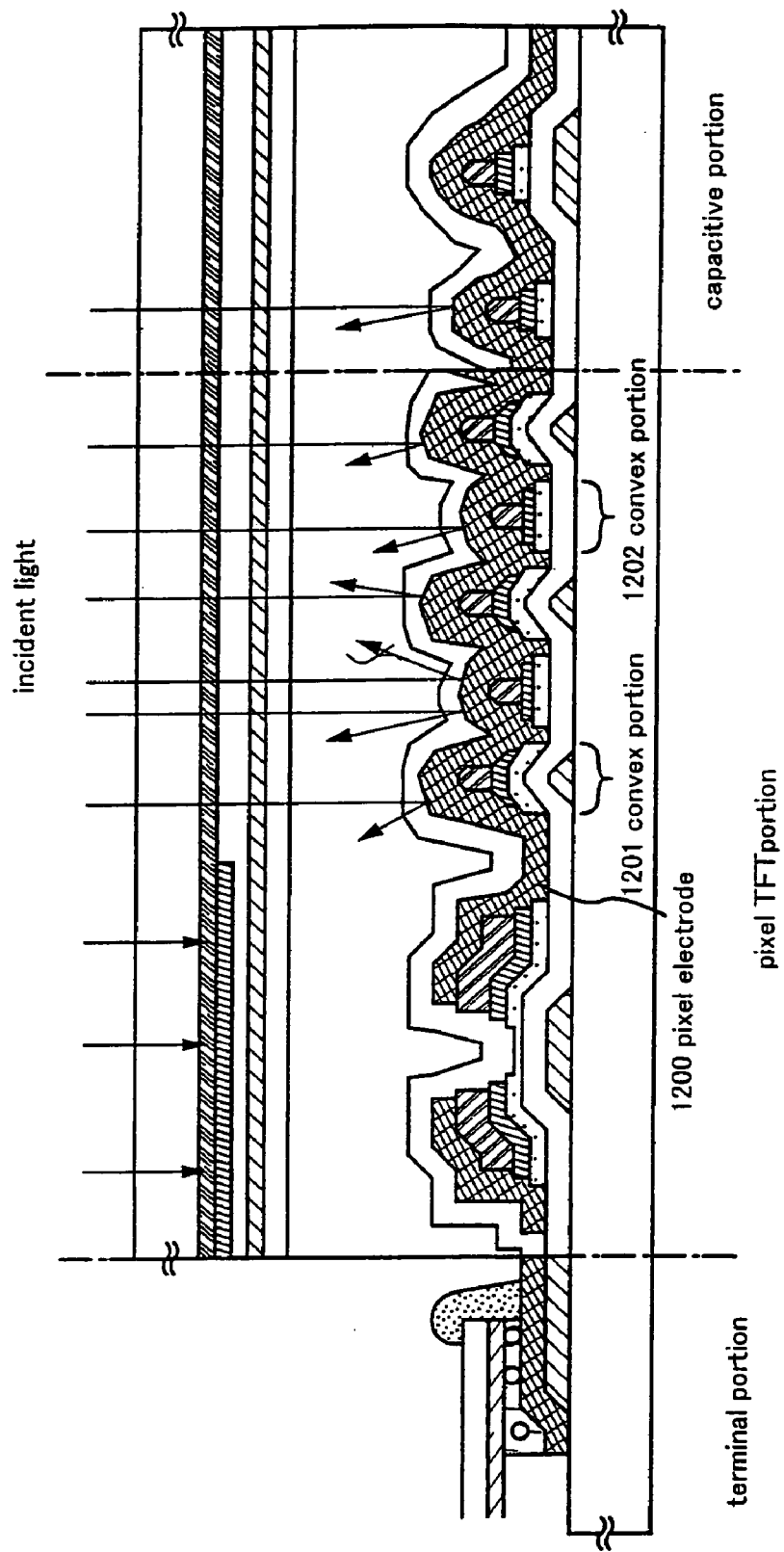
[Fig.12]

[Fig. 13]
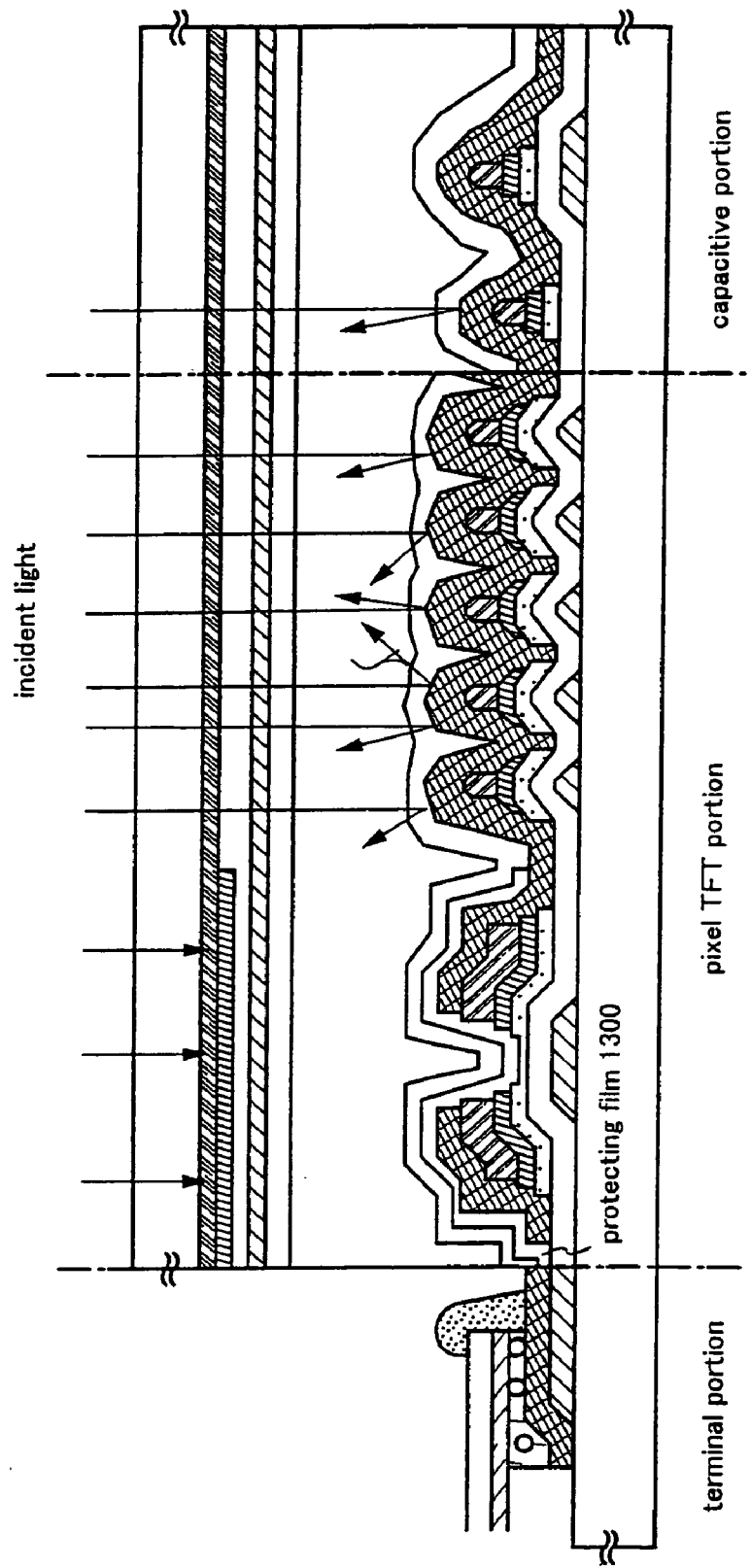

[Fig.14]
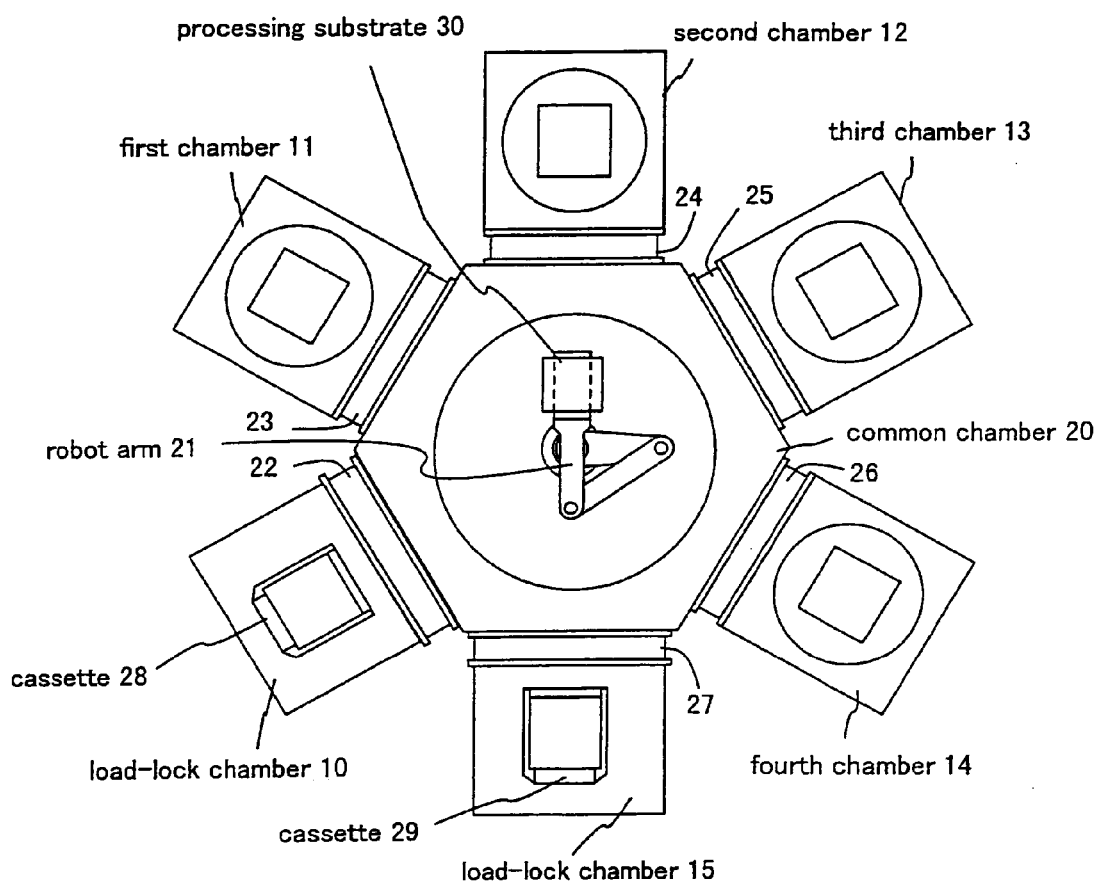

[Fig.15]
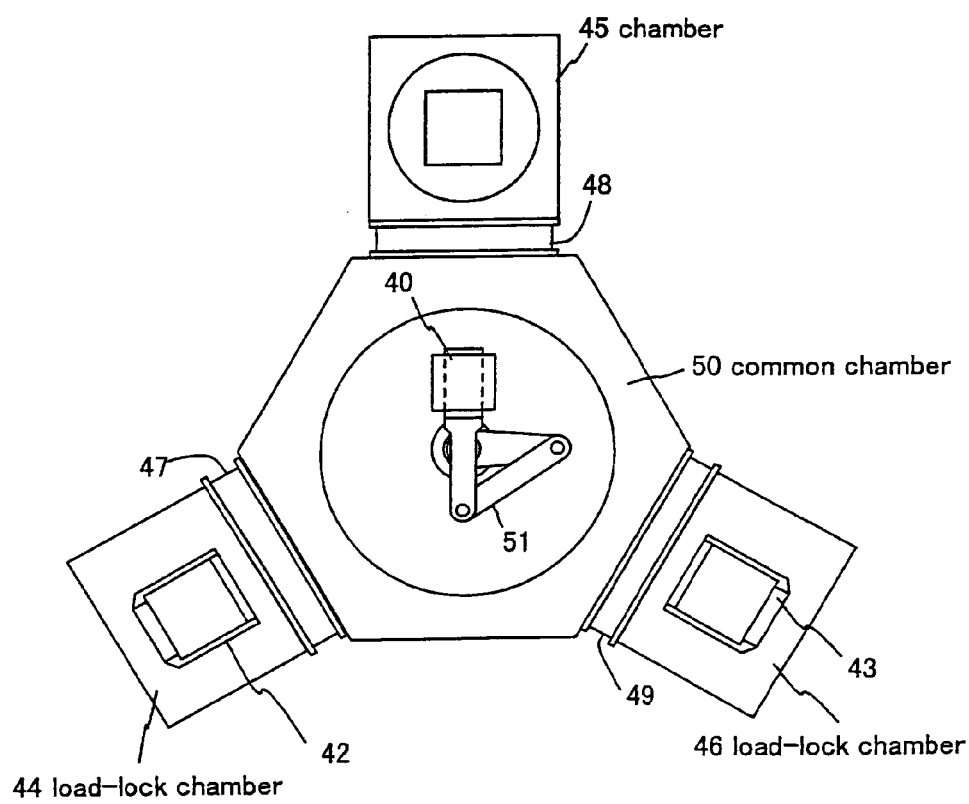

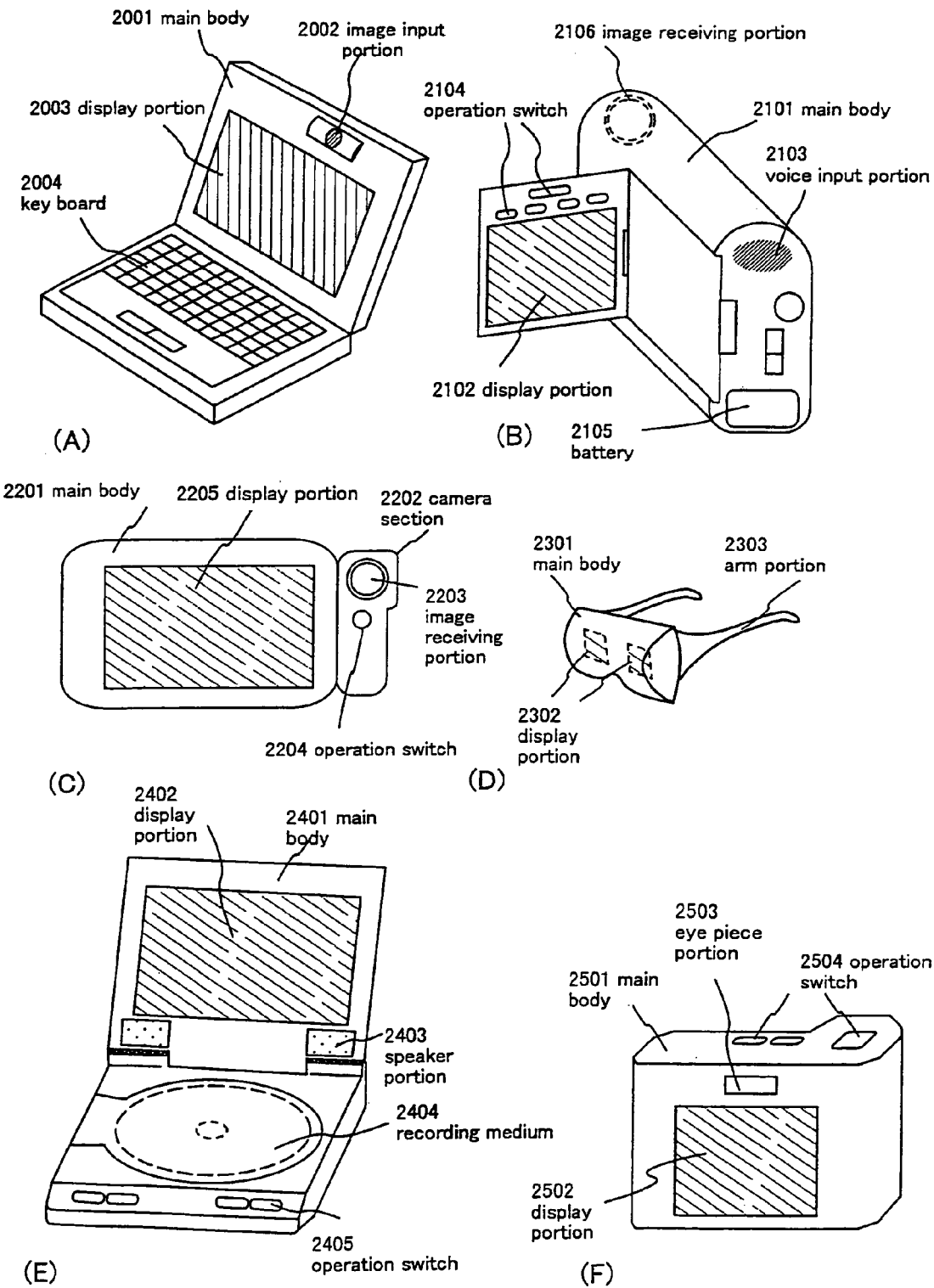
[Fig.16]

[Fig.17]
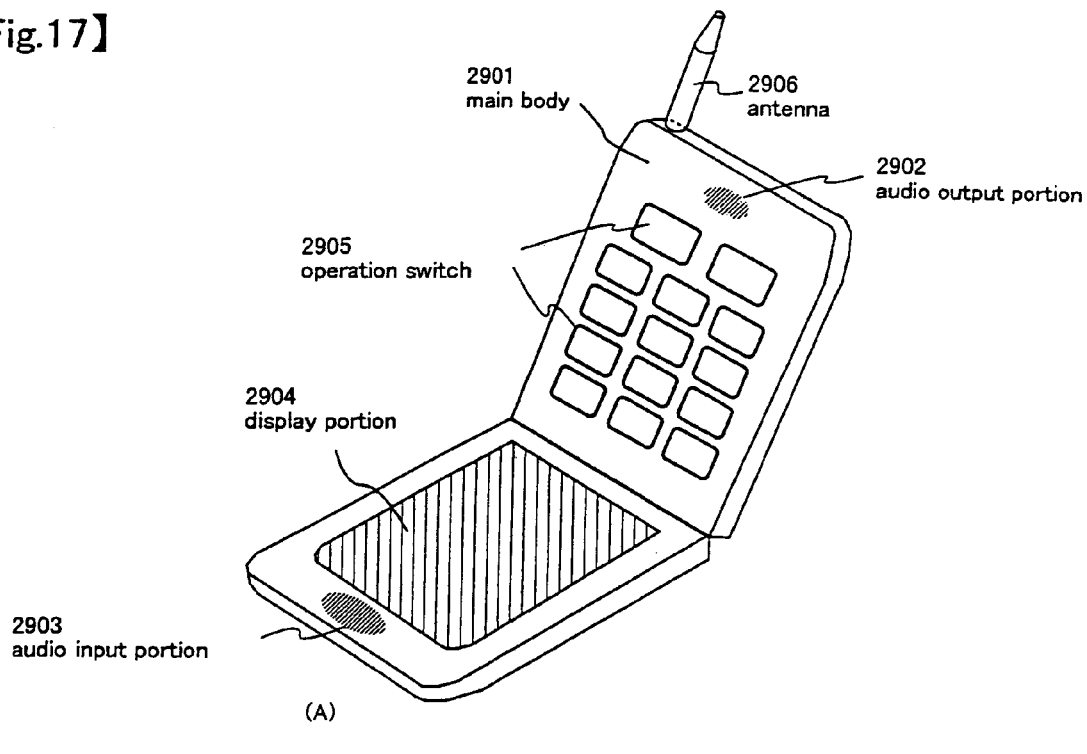
(A)
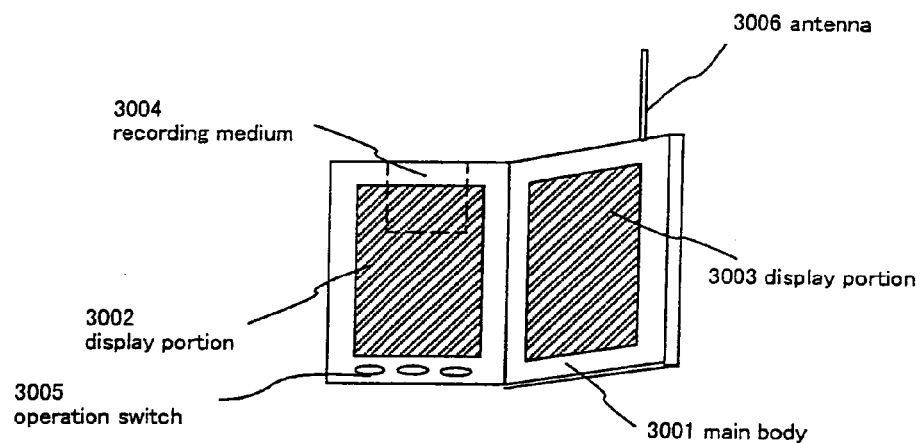
(B)
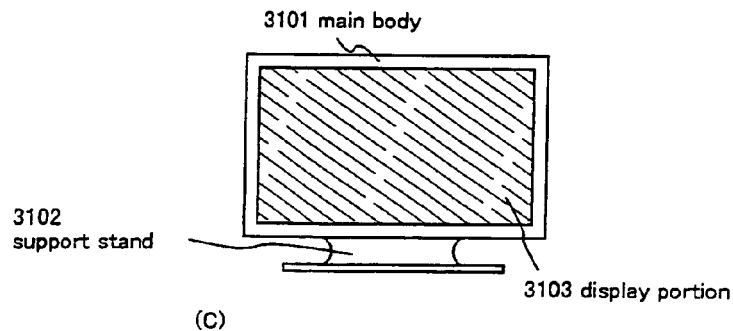
(C)

SEMICONDUCTOR DEVICE AND MANUFACTURING METHOD THEREOF

BACKGROUND OF THE INVENTION

1. Field of the Invention

The present invention relates to a semiconductor device having a circuit composed of a thin film transistor (hereafter referred to as TFT), and to a method of manufacturing thereof. For example, the present invention relates to an electro-optical device, typically a liquid crystal display panel, and to electronic equipment loaded with this type of electro-optical device as a part.

Note that, throughout this specification, semiconductor device denotes a general device which can function by utilizing semiconductor characteristics and that the category of semiconductor devices includes electro-optical devices, semiconductor circuits, and electronic equipment.

2. Description of Related Art

In recent years, techniques of structuring a thin film transistor (TFT) by using a semiconductor thin film (with a thickness on the order of several nm to several hundred of nm) formed on a substrate having an insulating surface have been in the spotlight. The thin film transistor is being widely applied in an electronic device such as an IC or an electro-optical device, and in particular, its development as a switching element of an image display device has been proceeding rapidly.

Conventionally, a liquid crystal display device is known as an image display device. Active matrix type liquid crystal display devices have come into widespread use due to the fact that, compared to passive type liquid crystal display devices, a higher definition image can be obtained. By driving pixel electrodes arranged in a matrix state in the active matrix type liquid crystal display device, a display pattern is formed on a screen. In more detail, by applying a voltage between a selected pixel electrode and an opposing electrode corresponding to the pixel electrode, optical modulation of a liquid crystal layer arranged between the pixel electrode and the opposing electrode is performed, and the optical modulation is recognized as a display pattern by an observer.

If roughly divided, two types of active matrix liquid crystal display devices are known, a transmitting type and a reflecting type.

In particular, a reflecting type liquid crystal display device has the advantage of lower power consumption compared to a transmitting type liquid crystal display device because a back light is not used, and the demand for its use as a direct view display in mobile computers and video cameras is increasing.

Note that the reflecting type liquid crystal display device utilizes an optical modulation effect of a liquid crystal, and display of light and dark is performed by selecting between a state of incident light reflected by a pixel electrode and output externally to the device, and a state of the incident light not output externally to the device, and in addition, image display is performed by combining the two states. Further, a color filter is attached to an opposing substrate in order to display colors. In general, the pixel electrode in a reflecting type liquid crystal display device is made from a metallic material having a high light reflectivity, and is electrically connected to a switching element such as a thin film transistor (hereafter referred to as a TFT).

The use of this type of active matrix type electro-optical device is spreading, and along with making the screen size larger, demands for higher definition, higher aperture ratio, and higher reliability are increasing. Further, at the same time, demands are increasing for improving productivity and lowering costs.

Conventionally, an amorphous silicon film is preferably used as an amorphous semiconductor film because of the capability of forming it on a large surface area substrate at a low temperature equal to or less than 300° C. Further, a reverse stagger type (or bottom gate type) TFT having a channel forming region formed of an amorphous semiconductor film is often used.

Furthermore, the color filters have R (red), G (green), and B (blue) coloration layers, and a light shielding mask covering only the pixel gap, and red, green, and blue colored light is extracted by transmitting light through the layers. Further, the light shielding mask is generally composed of a metallic film (such as chrome) or an organic film containing a black color pigment. By forming the color filters in positions corresponding to the pixels, the color of light output from each pixel can be changed. Note that the term positions corresponding to the pixels denotes positions coinciding with the pixel electrodes.

Conventionally, the production costs have been high in order to manufacture a TFT on a substrate with a technique of photolithography using at least 5 photomasks for an active matrix type electro-optical device. In order to improve productivity and yield, reducing the number of steps is considered to be an effective means.

Specifically, it is necessary to reduce the number of photomasks needed to produce the TFT. The photomask is used in a photolithography technique in order to form a photoresist pattern, which becomes an etching process mask, on the substrate.

By using one photomask, there are applied with steps such as applying resist, pre-baking, exposure, development, and post-baking, and steps of film deposition and etching before and after, and in addition, resist peeling, cleaning, and drying steps are added. Therefore, the entire process becomes complex, which leads to a problem.

Further, after forming the pixel electrode in the reflecting type liquid crystal display device, the surface is conventionally given unevenness by adding a step such as sand blasting or etching, preventing specular reflection and increasing the white color level by scattering reflected light.

Furthermore, in a conventional liquid crystal display panel using a metallic film as a color filter light shielding mask, a parasitic capacitance forms with other wirings, and a signal lag problem easily develops. In addition, when the organic film containing the black pigment is used as the color filter light shielding mask, a problem of an increase in the number of process steps develops.

The present invention is for answering these types of problems, and an object of the present invention is the realization of a reduction in production cost, and an increase in yield, by reducing the number of TFT manufacturing steps in an electro-optical device, typically an active matrix type liquid crystal display device.

Further, an object of the present invention is to provide a method of manufacture in which unevenness is formed for preventing specular reflection of the pixel electrode without increasing the number of process steps.

BRIEF SUMMARY OF THE INVENTION

In order to solve the above problems, the present invention is characterized in that the formation of a convex portion, in order to give unevenness to the surface of the pixel electrode and to scatter light, is performed with the same photomask as that for forming the TFT in the method of manufacturing the reflecting type liquid crystal display device. Note that the convex portion is suitably formed in a region, external to wirings (gate wiring, source wiring) and TFTs, which becomes a display region. Unevenness is then formed in the surface of the pixel electrode along the unevenness formed in the surface of an insulating film covering the convex portion. It is thus possible to form unevenness in the surface of the pixel electrode without increasing the number of process steps.

A structure of the present invention disclosed in this specification is:

a semiconductor device having:

a TFT containing a gate electrode on an insulating surface, an insulating film on said gate electrode, a semiconductor layer on said insulating film, an n-type semiconductor layer on said semiconductor layer, and a semiconductor layer on said n-type semiconductor layer;

a plurality of convex portions on said insulating surface; and a pixel electrode contacting said plurality of convex portions, having a uneven surface, and electrically connected to said TFT.

In the above structure, the semiconductor device is characterized in that the radius of curvature r of said convex portions in said pixel electrode having unevenness in its surface is from 0.1 to 4 µm, preferably from 0.2 to 2 µm.

In the above respective structures, the semiconductor device is characterized in that said plurality of convex portions is a lamination formed by:

a material layer formed of the same material as said gate electrode of said TFT;

a material layer formed of the same material as said insulating film of said TFT;

a material layer formed of the same material as said semiconductor layer of said TFT;

a material layer formed of the same material as said n-type semiconductor layer of said TFT; and a material layer formed of the same material as said conducting layer.

Further, in the above respective structures, the semiconductor device is characterized in that, within said lamination structuring said convex portion, a mask for the patterning of said material layer formed of the same material as said gate electrode of said TFT differs from a mask for the patterning of said material layer formed of the same material as said semiconductor layer of said TFT.

Furthermore, in the above respective structures, the semiconductor device is characterized in that, within said lamination structuring said convex portion:

said material layer formed of the same material as said semiconductor layer of said TFT;

said material layer formed of the same material as said n-type semiconductor layer of said TFT; and said material layer formed of the same material as said conducting layer are formed by using the same mask.

Further, in the above respective structures, the semiconductor device is characterized in that said plurality of convex portions has a plurality of convex portions with different heights.

Further, in the above respective structures, the semiconductor device is characterized in that said plurality of convex portions has a plurality of convex portions with differing lamination structures.

Further, in the above respective structures, the semiconductor device is characterized in that said semiconductor device is a reflecting type liquid crystal display device in which said pixel electrode is a film containing Al or Ag as its main constituent, or a lamination film of said films.

Further, in the above respective structures, the semiconductor device is characterized in that said semiconductor layer is an amorphous semiconductor film.

Further, in the above respective structures, the semiconductor device is characterized in that said gate electrode is made from a film containing as its main constituent an element selected from the group consisting of: Al, Cu, Ti, Mo, W, Ta, Nd, and Cr; or an alloy film of these elements; or a lamination film of these elements.

Further, the present invention is characterized in that, not only is a light shielding mask (black matrix) used, but also in that it has a pixel structure for light shielding of the TFT and between pixels. One means of light shielding is characterized by forming, on an opposing substrate, a lamination film of two coloration layers (a lamination film of a red color coloration layer and a blue color coloration layer, or a lamination film of a red color coloration layer and a green color coloration layer) as a light shielding portion so as to overlap the TFTs of the element substrate.

In this specification, the term red color coloration layer denotes a layer which absorbs a portion of the light irradiated to the coloration layer and outputs red colored light. Furthermore, the term blue color coloration layer similarly denotes a layer which absorbs a portion of the light irradiated to the coloration layer and outputs blue light, and the term green color coloration layer denotes a layer which absorbs a portion of the light irradiated to the coloration layer and outputs green light.

Further, in the respective structures of the above invention, the semiconductor device is characterized in that said semiconductor device has:

a first light shielding portion composed of a lamination of a first coloration layer and a second coloration layer; and a second light shielding portion composed of a lamination of said first coloration layer and a third coloration layer;

in which said first light shielding portion and said second light shielding portion are formed overlapping between an arbitrary pixel electrode and an adjacent pixel electrode.

In the above structure, the semiconductor device is characterized in that the amount of reflected light of said first light shielding portion differs from the amount of reflected light of said second light shielding portion. Further, said first coloration layer is red colored. Furthermore, said second coloration layer is blue colored. Still further, said third coloration layer is green colored.

Further, in the above structure, the semiconductor device is characterized in that said first light shielding portion and said second light shielding portion are formed on the opposing substrate.

In addition, the present invention is characterized in that a channel etch type bottom gate TFT structure is employed, whereby patterning of a source region and a drain region is performed with the same mask as patterning of the pixel electrode. It is possible to reduce the number of masks by doing so.

Further, in order to realize the above structures, a structure of the present invention is a method of manufacturing a semiconductor device, having:

a first step of patterning a first conducting film on an insulating surface, forming a first conducting layer;

a second step of forming a lamination of an insulating film, a semiconductor film, and an n-type semiconductor film on said first conducting layer;

a third step of forming a second conducting film on said n-type semiconductor film;

a fourth step of patterning: said semiconductor film overlapping said first conducting layer; said n-type semiconductor film overlapping said semiconductor film; and said second conducting film overlapping said n-type semiconductor film; forming a convex portion composed of a lamination structure of said first conducting layer, said insulating film, said semiconductor layer, said n-type semiconductor layer, and said second conducting layer; and a fifth step of forming a pixel electrode covering said convex portion characterized in that said pixel electrode overlaps said convex portion and has unevenness in its surface.

In the above manufacturing process, the method is characterized in that:

a gate electrode is formed at the same time as said step 1;

a semiconductor layer, an n-type semiconductor layer, and a second conducting layer are formed at the same time as said step 4; and a portion of said semiconductor layer is removed at the same time as said step 5, forming a source region and a drain region from said n-type semiconductor layer, and forming a source electrode and a drain electrode from said second conducting layer, forming a channel etch type TFT.

Further, in the above manufacturing processes, the method is characterized in that said pixel electrode is electrically connected to said channel etch type TFT formed in the same step as said convex portion.

Furthermore, in the above manufacturing processes, the method is characterized in that said semiconductor device is a reflecting type liquid crystal display device in which said pixel electrode is made from a film containing Al or Ag as its main constituent, or a lamination film of said films.

Still further, in the above manufacturing processes, the method is characterized in that said insulating film, said semiconductor film, and said n-type semiconductor film are formed in succession without exposure to the atmosphere.

Moreover, in the above manufacturing processes, the method is characterized in that said insulating film, said semiconductor film, and said n-type semiconductor film are formed by plasma CVD.

Further, in the above manufacturing processes, the method is characterized in that said insulating film, said semiconductor film, and said n-type semiconductor film are formed by sputtering.

EFFECT OF THE INVENTION

An electro-optical device prepared with a pixel TFT portion having a reverse stagger type n-channel TFT, a pixel electrode having a uneven surface, and a storage capacitor can be realized by three photolithography steps using three photomasks in the present invention.

BRIEF DESCRIPTION OF THE DRAWINGS

FIG. 1 is a drawing showing the radius of curvature r of a convex portion in a pixel electrode.

FIG. 2 shows diagrams showing a process of manufacturing an AM-LCD.

FIG. 3 shows diagrams showing the process of manufacturing the AM-LCD.

FIG. 4 is a diagram showing the process of manufacturing the AM-LCD.

FIG. 5 is a diagram showing an external view of an AM-LCD.

FIG. 6 is a diagram showing a top view of a pixel.

FIG. 7 is a diagram showing a cross section of a COG type structure.

FIG. 8 is a diagram showing an external view of a COG type structure.

FIG. 9 shows diagrams showing a cross section of a COG type structure.

FIG. 10 shows top views of convex portions.

FIG. 11 is a diagram showing a cross section of an AM-LCD.

FIG. 12 is a diagram showing a cross section of an AM-LCD.

FIG. 13 is a diagram showing a cross section of an AM-LCD.

FIG. 14 is a diagram showing a multi-chamber film deposition device.

FIG. 15 is a diagram showing a single chamber film deposition device.

FIG. 16 shows diagrams showing examples of electronic equipment.

FIG. 17 shows diagrams showing examples of electronic equipment.

DETAILED DESCRIPTION OF THE INVENTION

Embodiment Mode of the Invention

The embodiment mode of the present invention are explained below using FIGS. 1 to 4, 6, and 10A to 10G.

The present invention possesses, in a pixel portion, a convex portion 107 formed at the same time as a pixel TFT, and a rough portion on the surface of a pixel electrode 108d formed on the convex portion 107.

Further, the present invention is characterized in that specular reflection of the pixel electrode 108d is prevented by making the radius of curvature r of the convex portion of the pixel electrode 108d from 0.1 to 4 µm, preferably from 0.2 to 2 µm, as shown in FIG. 1.

Note that, the present invention is characterized in that an increase in the number of process steps is not necessary in manufacturing unevenness for preventing specular reflection of the pixel electrode 108d, as shown in FIGS. 2 to 4.

As shown in FIGS. 2 to 4, the convex portion 107 is formed using a mask pattern for forming a gate wiring, or a mask pattern for forming the pixel electrode. Further, an example of using a lamination of a first conducting layer 101c, an insulating film 102b, a semiconductor layer 103c, an n-type semiconductor layer 104c, and a second conducting layer 105c, formed when the pixel TFT is manufactured, as the convex portion 107 is shown here, but the convex portion 107 is not limited to this in particular, and a single layer or a lamination of a combination of these layers can be used. For example, as shown in a capacitive portion in FIGS. 2 to 4, the convex portion may be formed from a lamination of the semiconductor layer, the n-type semiconductor layer, and the second conducting layer, and the convex portion may also be formed from a lamination of the first conducting layer and the insulating film. By doing so, a convex portion having a plurality of heights can be formed without increasing the number of process steps. Further, mutually adjacent convex portions are isolated by 0.1 µm or greater, preferably by 1 µm or greater.

Note that an example of forming the convex portions having the first conducting layer 101c and the semiconductor layer 103c which differ in size is shown here, but there is no particular limitation. Note also that the reflected light is well scattered by having random sizes of the convex portions, which is preferable. For example, the convex portions may be formed having a polygonal cross section in the diameter direction, and they may be formed without being symmetrical. For example, any of the shapes shown in FIGS. 10(A) to 10(G) may be used. Further, the convex portions may be arranged regularly or irregularly.

Further, there are no particular limitations on the arrangement of the convex portions, provided that they are under the pixel electrode which becomes the image region of the pixel portion. FIG. 6 shows an example of a top view of a pixel, and in FIG. 6 a region in which a capacitor wiring 101$d$ and the pixel electrode overlay becomes the display region, and therefore unevenness is formed in the surface of the pixel electrode of the lamination of the capacitor wiring 101$d$, the insulating film 102$b$, the semiconductor layer, the n-type semiconductor layer, and the second conducting layer.

Furthermore, there are no limitations placed on the size of the convex portion (the surface area as seen from above), but it may be set within a range from 1 to 400 $\mu m^2$ (preferably between 25 and 100 $\mu m^2$).

Thus, without increasing the number of manufacturing steps, the present invention can form the pixel electrode having the uneven surface.

An example of forming the pixel electrodes contacting the convex portions is shown here, but one mask may be added and a contact hole may also be formed after covering the convex portions with an insulating film.

When covering the convex portions with the insulating film, unevenness is formed in the surface of the insulating film, and the surface of the pixel electrodes formed on top is also made uneven. The height of the convex portion of the pixel electrodes is made from 0.3 to 3 $\mu m$, preferably between 0.5 and 1.5 $\mu m$. When incident light is reflected by the roughness formed in the surface of the pixel electrodes, the light can be scattered, as shown in FIG. 4.

Note that an inorganic insulating film or an organic resin film can be used as the insulating film. It is possible to regulate the curvature of the roughness in the pixel electrode by the insulating film material. Further, when using an organic resin as the insulating film, one with a viscosity from 10 to 1000 cp, preferably between 40 and 200 cp, which is sufficiently influenced by the convex portion and forms unevenness in its surface, is used. Note that if a solvent which does not easily evaporate is used, then even though the viscosity of the organic resin film is reduced, unevenness can be formed.

Furthermore, when an inorganic insulating film is used as the insulating film, it functions as a passivation film.

A more detailed explanation of the present invention, structured as above, is performed with the embodiments shown below.

EMBODIMENTS

Embodiment 1

An embodiment of the invention is explained using FIGS. 2 to 6. Embodiment 1 shows a method of manufacturing a liquid crystal display device, and detailed description is made, by following the process steps, on a method for forming a channel-etched type TFT for pixel section and a storage capacitor connected to the TFT over the substrate. Further, a manufacturing process for a terminal section, formed in an edge portion of the substrate, and for electrically connecting to wirings of circuits formed on other substrates, is shown at the same time in the same figures.

In FIG. 2(A), a glass substrate, comprising such as barium borosilicate glass or aluminum borosilicate glass, typically Corning Corp. #7059 or #1737, can be used as a substrate 100 having translucency. In addition, a translucent substrate such as a quartz substrate or a plastic substrate can also be used.

Next, after forming a first conductive layer on the entire surface of the substrate, a first photolithography process is performed, a resist mask is formed, unnecessary portions are removed by etching, and wirings and electrodes (a gate wiring 101$b$ including a gate electrode, a first conductive layer 101$c$, a capacitor wiring 101$d$ and a terminal 101$a$) are formed. The first conductive layer 101$c$ is arranged in the region surrounded by the gate wirings and the source wirings, namely the region where pixel electrodes are formed and becomes a display region. Note that the shape of the first conductive layer 101$c$ is not specifically limited and its cross section in the diameter direction may be a polygon or the cross section may be an asymmetric shape. For example, the shape of the first conductive layer 101$c$ may be a columnar or a plasmatic shape, or it may further be a cone or a pyramid. Further, etching is performed at this time to form tapered portion at least in the edge of the gate electrode 101$b$.

It is preferable to form the gate wiring 101$b$ including the gate electrode, the first conductive layer 101$c$, the capacitor wiring 101$d$, and the terminal 101$a$ from a low resistivity conductive material such as aluminum (Al) or copper (Cu), but simple Al has problems such as inferior heat resistance and easily corrodes, and therefore it is combined with a heat resistant conductive material. Further, an Ag—Pd—Cu alloy may also be used as the low resistance conductive material. One element selected from the group consisting of titanium (Ti), tantalum (Ta), tungsten (W), molybdenum (Mo), chromium (Cr), neodymium (Nd) or an alloy comprising the above elements, or an alloy film of a combination of the above elements, or a nitrated compound comprising the above elements is formed as the heat resistant conductive material. For example, a lamination film of Ti and Cu, and a lamination film of TaN and Cu can be given. Furthermore, forming in combination with a heat resistant conductive material such as Ti, Si, Cr, or Nd, it is preferable because of improved levelness. Further, only such heat resistant conductive film may also be formed, for example, in combination with Mo and W.

In realizing the liquid crystal display device, it is preferable to form the gate electrode and the gate wiring by a combination of a heat resistant conductive material and a low resistivity conductive material. An appropriate combination in this case is explained.

Provided that the screen size is on the order of, or less than, 5 inch diagonal type, a two layer structure of a lamination of a conductive layer (A) made from a nitride compound of a heat resistant conductive material, and a conductive layer (B) made from a heat resistant conductive material is used. The conductive layer (B) may be formed from an element selected from the group consisting of Al, Cu, Ta, Ti, W, Nd, and Cr, or from an alloy of the above elements, or from an alloy film of a combination of the above elements, and the conductive layer (A) is formed from a film such as a tantalum nitride (TaN) film, a tungsten nitride (WN) film, or a titanium nitride (TiN) film. For example, it is preferable to use a double layer structure of a lamination of Cr as the conductive layer (A) and Al containing Nd as the conductive layer (B). The conductive layer (A) is given a thickness of 10 to 100 nm (preferably between 20 and 50 nm), and the conductive layer (B) is made with a thickness of 200 to 400 nm (preferably between 250 and 350 nm).

On the other hand, in order to be applied to a large screen, it is preferable to use a three layer structure of a lamination of a conductive layer (A) made from a heat resistant conductive material, a conductive layer (B) made from a low resistivity conductive material, and a conductive layer (C) made from a heat resistant conductive material. The conductive layer (B) made from the low electrical resistance conductive material is formed from a material comprising aluminum (Al), and in addition to pure Al, Al containing between 0.01 and 5 atomic % of an element such as scandium (Sc), Ti, Nd, or silicon (Si), etc., is used. The conductive layer (C) is effective in preventing generation of hillocks in the Al of the conductive layer (B). The conductive layer (A) is given a thickness of 10 to 100 nm (preferably between 20 and 50 nm), the conductive layer (B) is made from 200 to 400 nm thick (preferable between 250 and 350 nm), and the conductive layer (C) is from 10 to 100 nm thick (preferably between 20 and 50 nm). In this Embodiment, the conductive layer (A) is formed from a Ti film with a thickness of 50 nm, made by sputtering with a Ti target, the conductive layer (B) is formed from an Al film with a thickness of 200 nm, made by sputtering with an Al target, and the conductive layer (C) is formed from a 50 nm thick Ti film, made by sputtering with a Ti target.

An insulating film 102a is formed next on the entire surface. The insulating film 102a is formed using sputtering, and has a film thickness of 50 to 200 nm.

For example, a silicon nitride film is used as the insulating film 102a, and formed to a thickness of 150 nm. Of course, the gate insulating film is not limited to this type of silicon nitride film, and another insulating film such as a silicon oxide film, a silicon oxynitride film, or a tantalum oxide film may also be used, and the gate insulating film may be formed from a single layer or a lamination structure made from these materials. For example, a lamination structure having a silicon nitride film as a lower layer and a silicon oxide film as an upper layer may be used.

Next, an amorphous semiconductor film 103a is formed with a thickness of 50 to 200 nm (preferably between 100 and 150 nm) on the insulating film 102a over the entire surface by using a known method such as plasma CVD or sputtering (not shown in the figure). Typically, an amorphous silicon (a-Si) film is formed with a thickness of 100 nm by sputtering using a silicon target. In addition, it is also possible to apply a microcrystalline semiconductor film, or a compound semiconductor film having an amorphous structure, such as an amorphous silicon germanium film ($Si_xGe_{(1-x)}$, where 0<x<1), or an amorphous silicon carbide ($Si_xC_y$).

A second amorphous semiconductor film 104a which contains an impurity element imparting one conductivity type (n-type or p-type) is formed next with a thickness of 20 to 80 nm. The second amorphous semiconductor film which contains an impurity element imparting one conductivity type (n-type or p-type) is formed on the entire surface by a known method such as plasma CVD or sputtering. In this Embodiment, n-type semiconductor film 106, containing an n-type impurity element, is formed using a silicon target in which phosphorous (P) has been added. Alternatively, film deposition may be performed by sputtering using a silicon target in an atmosphere containing phosphorous. In addition, the n-type semiconductor film which contains an impurity element imparting n-type may also be formed from a hydrogenated microcrystalline silicon film (μc-Si:H).

Next, a second conductive film 105a made from a metallic material is formed by sputtering or vacuum evaporation. Provided that ohmic contact with the n-type semiconductor film 104a can be made, there are no particular limitation on the material of the second semiconductor film 105a, and an element selected from the group consisting of Al, Cr, Ta, and Ti, or an alloy comprising the above elements, and an alloy film of a combination of the above elements or the like can be given. Sputtering is used in this Embodiment, and a 50 to 150 nm thick Ti film, an aluminum (Al) film with a thickness between 300 and 400 nm above the Ti film, and a Ti film with a thickness of 100 to 150 nm thereon are formed as the second conductive film 105a. (FIG. 2A.)

The insulating film 102a, the amorphous semiconductor film 103a, the n-type semiconductor film 104a containing an impurity element which imparts n-type conductivity, and the second conductive film 105a are all manufactured by a known method, and can be manufactured by plasma CVD or sputtering. These films (102a, 103a, 104a, and 105a) are formed in succession by sputtering, and suitably changing the target or the sputtering gas in this Embodiment. The same reaction chamber, or a plurality of reaction chambers, in the sputtering apparatus is used at this time, and it is preferable to laminate these films in succession without exposure to the atmosphere. By thus not exposing the films to the atmosphere, the mixing in of impurities can be prevented.

Next, a second photolithography process is then performed, a resist mask 106 is formed, and by removing unnecessary portions by etching, a wiring (becoming a source wiring and a drain electrode by subsequent processing) 105b is formed. Wet etching or dry etching is used as the etching process at this time. The second conductive film 105a, the n-type semiconductor film 104a containing an impurity element which imparts n-type conductivity, and the amorphous semiconductor film 103a are etched in order with the resist mask 106 as a mask. The wiring 105b composed of the second conductive film, a n-type semiconductor film 104b containing an impurity element which imparts n-type conductivity, and an amorphous semiconductor film 103b are each formed in the pixel TFT portion. In this Embodiment, the second conductive film 105a in which the Ti film, the Al film, and the Ti film are laminated in order is etched by dry etching using a gas mixture of $SiC_4$, $Cl_2$, and $BCl_3$ as a reaction gas, and the reaction gas is substituted with a gas mixture of $CF_4$ and $O_2$, and the amorphous semiconductor film 103a and the n-type semiconductor film 104a, containing the impurity element for imparting n-type conductivity, are selectively removed. (FIG. 2B.) Further, a lamination of a semiconductor layer 103c, an n-type semiconductor layer 104c and a second conductive layer 105c is formed in the area which becomes display region of the pixel portion. A capacitor wiring 101d and an insulating film 102a remained in the capacitor portion, and similarly in the terminal portion a terminal 101a and an insulating film 102a remained.

Next, after removing the resist mask 106, a resist mask is formed using a shadow mask, and the insulating film 102a covering the pad portion of the terminal portion is selectively removed, forming an insulating film 102b, after which the resist mask is removed. (FIG. 2D.) Further, as a substitute for the shadow mask, a resist mask may also be formed by screen printing as an etching mask.

A convex portion 107 which comprises a lamination of a first conductive layer 101c, an insulating film 102b, a semiconductor layer 103c, an n-type semiconductor layer 104c and a second conductive layer 105c is formed in the portion which becomes a display region of the pixel portion, by a second photolithography process. As shown in FIG. 2(B), cross section of the etched surface of the convex portion 107 becomes tiered depending of the etching conditions for the second photolithography process, and the dimension of the cross section becomes gradually larger as it gets nearer to the substrate.

A third conductive film 108a comprising a conductive film having reflectivity is next deposited over the entire surface. (FIG. 3(A)) A material which has reflective property, such as Al, Ag, etc., may be used as the third conductive film 108a.

The third photolithography process is next performed, resist mask 109 is formed, unnecessary portions are removed by etching, and amorphous semiconductor film 103e, source region 104e, drain region 104f, source electrode 105e, drain electrode 105f and pixel electrode 108d are formed. (FIG. 3(B))

The third photolithography process patterns the third conductive film 108a, and at the same time removes a part of the wiring 105b, the n-type semiconductor film 104b containing an impurity element which imparts n-type conductivity and the amorphous semiconductor film 103b by etching, forming an opening. Note that the etching may be performed in this third photography process by only dry etching in which the operator properly chooses the reaction gas, or it may be performed by only wet etching by properly choosing the reaction solution, or dry etching and wet etching may be suitably used.

Further, the lower portion of the opening reaches the amorphous semiconductor film, and the amorphous semiconductor film 103e is formed having a concave portion. The wiring 105b is separated into the source wiring 105e and the drain electrode 105f by the opening, and the n-type semiconductor film 104, containing an impurity element which imparts n-type conductivity is separated into the source region 104e and the drain region 104f. Furthermore, the third conductive film 108c contacting the source wiring covers the source wiring, and during subsequent manufacturing processes, especially during a rubbing process, fulfills a role of preventing static electricity from developing. An example of forming the third conductive film 108c on the source wiring is shown in this Embodiment, but the third conductive film 108c may also be removed.

Moreover, a storage capacitor is formed in the third photolithography process by the capacitor wiring 101d and the pixel electrode 108d, with the insulating film 102b in the capacitor portion as a dielectric.

In addition, because the pixel electrode 108d is formed on the convex portion 107, light scattering property can be devised by providing roughness on the surface of the pixel electrode 108d. Note that FIG. 6 shows an example of the top view of the pixel portion. Same symbols are used for the sections corresponding to FIGS. 2 and 3.

The third conductive film 108b comprising a conductive film formed in the terminal portion is left by covering with the resist mask 109 during the third photolithography process.

By thus using three photomasks and performing three photolithography processes, the pixel TFT portion having the reverse stagger type n-channel type TFT and the storage capacitor can be completed.

Note that an example of the top view of the pixel is shown in FIG. 6. In FIG. 6, the region in which the capacitor wiring 101d and the pixel electrode overlap becomes a display region, unevenness is formed on the surface of the pixel electrode by the laminate of the capacitor wiring 101d, the insulating film 102b, the semiconductor layer, the n-type semiconductor layer and the second conductive layer. Further, same symbols are used for the sections corresponding to FIGS. 2 to 4.

Though it was necessary to add the process for forming the uneven portions conventionally, the present Embodiment formed the uneven portion on the pixel electrode without increasing the process at all, because the uneven portions are manufactured at the same time with the TFTs.

Thus by structuring a pixel portion by arranging them in correspondent to the respective pixels, one substrate for manufacturing an active matrix electro-optical device can be formed. In this specification such substrate is referred to active matrix substrate for convenience.

An alignment film 110 is selectively formed next in only the pixel portion of the active matrix substrate. Screen printing may be used as a method of selectively forming the alignment film 110, and a method of removal in which a resist mask is formed using a shadow mask after application of the alignment film may also be used. Normally, a polyimide resin is often used in the alignment film of the liquid crystal display element.

Next, a rubbing process is then performed on the alignment film 110, orienting the liquid crystal elements so as to possess a certain fixed pre-tilt angle.

An opposing substrate 112 is next prepared. Coloring layers 113 and 114 and planarization film 115 are formed on the opposing substrate 112. A second light shielding portion is formed by partially overlapping the red colored coloring layer 113 and the blue colored coloring layer 114. Note that though not shown in FIG. 4, a first light shielding portion is formed by partially overlapping the red coloring layer and the green coloring layer.

An opposing electrode 116 is next formed in the pixel portion, an alignment film 117 is formed on the entire surface of the opposing substrate and rubbing treatment is performed so that the liquid crystal molecules are oriented having a certain constant pre-tilt angle.

Next after sticking the active matrix substrate and the opposing substrate 112 together by a sealant by holding a distance between the substrates with columnar or sphere spacers, a liquid crystal material 111 is injected between the active matrix substrate and the opposing substrate. A known material may be used for the liquid crystal material 111 and the opening for injection is sealed by a resin material.

Next, a flexible printed circuit (FPC) is connected to the input terminal 101a of the terminal portion. The FPC is formed by a copper wiring 119 on an organic resin film 118 such as polyimide, and is connected to the third conductive film covering the input terminal by an anisotropic conductive adhesive. The anisotropic conductive adhesive comprises an adhesive 120 and particles 121, with a diameter of several tens to several hundred of μm and having a conductive surface plated by a material such as gold, which are mixed therein. The particles 121 form an electrical connection in this portion by connecting the third conductive film 108b on the input terminal 101a and the copper wiring 119. In addition, in order to increase the mechanical strength of this region, a resin layer 122 is formed.

FIG. 5 is a diagram explaining the placement of the pixel portion and the terminal portion of the active matrix substrate. A pixel portion 211 is formed on a substrate 210, gate wirings 208 and source wirings 207 are formed intersecting on the pixel portion, and the n-channel TFT 201 connected to this is formed corresponding to each pixel. The pixel electrode 108b and a storage capacitor 202 are connected to the drain side of the n-channel TFT 201, and the other terminal of the storage capacitor 202 is connected to a capacitor wiring 209. The structure of the n-channel TFT and the storage capacitor is the same as that of the n-channel TFT and the storage capacitor shown in FIG. 4.

An input terminal portion 205 for inputting a scanning signal is formed in one edge portion of the substrate, and is connected to a gate wiring 208 by a connection wiring 206. Further, an input terminal portion 203 for inputting an image signal is formed in the other edge portion, and is connected to a source wiring 207 by a connection wiring 204. A plurality of the gate wiring 208, the source wiring 207, and the capacitor wiring 209 are formed in accordance with the pixel density. Furthermore, an input terminal portion 212 for inputting an image signal and a connection wiring 213 may be formed, and may be connected to the source wiring alternately with the input terminal portion 203. An arbitrary number of the input terminal portions 203, 205, and 212 are formed, which may be suitably determined by the operator.

Embodiment 2

FIG. 7 is an example of a method of mounting a liquid crystal display device. The liquid crystal display device has an input terminal portion 302 formed in an edge portion of a substrate 301 on which TFTs are formed, and as shown by embodiment 1, this is formed by a terminal 303 formed from the same material as a gate wiring. An opposing substrate 304 is joined to the substrate 301 by a sealant 305 encapsulating spacers 306, and in addition, polarizing plate 307 is formed. This is then fixed to a casing 321 by spacers 322.

Note that the TFT obtained in Embodiment 1 having an active layer formed by an amorphous semiconductor film has a low electric field effect mobility, and only approximately 1 cm$^2$/Vsec is obtained. Therefore, a driver circuit for performing image display is formed by an IC chip, and mounted by a TAB (tape automated bonding) method or by a COG (chip on glass) method. In this Embodiment, an example is shown of forming the driver circuit in an IC chip 313, and mounting by using the TAB method. A flexible printed circuit (FPC) is used, and the FPC is formed by a copper wiring 310 on an organic resin film 309, such as polyimide, and is connected to the input terminal 302 by an anisotropic conductive adhesive. The input terminal is a conductive film formed on and contacting the wiring 303. The anisotropic conductive adhesive is structured by an adhesive 311 and particles 312, with a diameter of several tens to several hundred of μm and having a conductive surface plated by a material such as gold, which are mixed therein. The particles 312 form an electrical connection in this portion by connecting the input terminal 302 and the copper wiring 310. In addition, in order to increase the mechanical strength of this region, a resin layer 318 is formed.

The IC chip 313 is connected to the copper wiring 310 by a bump 314, and is sealed by a resin material 315. The copper wiring 310 is then connected to a printed substrate 317 on which other circuits such as a signal processing circuit, an amplifying circuit, and a power supply circuit are formed, through a connecting terminal 316. In the reflection type liquid crystal display device shown here, a device which is capable of display by introducing light from the light source using light conductor plate 320 is provided, namely an LED light source 319, diffraction plate 323 and a light conductor 320 are provided on the opposing substrate 304 in a reflection type liquid crystal display device incorporating a front light.

Embodiment 3

FIG. 8 is a diagram which schematically shows a state of constructing an electro-optical display device by using the COG method. A pixel region 803, an external input-output terminal 804, and a connection wiring 805 are formed on a first substrate. Regions surrounded by dotted lines denote a region 801 for attaching a scanning line side IC chip, and a region 802 for attaching a data line side IC chip. An opposing electrode 809 is formed on a second substrate 808, and this is joined to the first substrate 800 by using a sealing material 810. A liquid crystal layer 811 is formed inside the sealing material 810 by injecting a liquid crystal. The first substrate and the second substrate are joined with a predetermined gap, and this is set from 3 to 8 μm for a nematic liquid crystal, and it is set at between 1 and 4 μm for the case of smetic liquid crystal.

IC chips 806 and 807 have circuit structures which differ between the data line side and the scanning line side. The IC chips are mounted on the first substrate. An FPC (flexible printed circuit) 812 is attached to the external input-output terminal 804 in order to input power supply and control signals from the outside. In order to increase the adhesion strength of the FPC 812, a reinforcing plate 813 may be formed. The electro-optical device can thus be completed. If an electrical inspection is performed before mounting the IC chips on the first substrate, then the final process yield of the electro-optical device can be improved, and the reliability can be increased.

Further, a method such as a method of connection using an anisotropic conductive material or a wire bonding method, can be employed as the method of mounting the IC chips on the first substrate. FIG. 9 show an example of such. FIG. 9(A) shows an example in which an IC chip 908 is mounted on a first substrate 901 using an anisotropic conductive material. A pixel region 902, a lead wire 906, a connection wiring and an input-output terminal 907 are formed on the first substrate 901. A second substrate is bonded to the first substrate 901 by using a sealing material 904, and a liquid crystal layer 905 is formed therebetween.

Further, an FPC 912 is bonded to one edge of the connection wiring and the input-output terminal 907 by using an anisotropic conductive material. The anisotropic conductive material is made from a resin 915 and conductive particles 914 having a diameter of several tens to several hundred of μm and plated by a material such as Au, and the wiring 913 formed with the FPC 912 and the connection wiring and input-output terminal 907 are electrically connected by the conductive particles 914. The IC chip 908 is similarly bonded to the first substrate by an anisotropic conductive material. An input-output terminal 909 provided with the IC chip 908 and the lead wire 906, or a connection wiring and the input-output terminal 907 are electrically connected by conductive particles 910 mixed into a resin 911.

Furthermore, as shown by FIG. 9(B), the IC chip may be fixed to the first substrate by an adhesive material 916, and an input-output terminal and a lead wire of the stick driver or a connection wiring may be connected by an Au wire 917. Then, this is all sealed by a resin 918.

The method of mounting the IC chip is not limited to the method based on FIGS. 8 and 9, and it is also possible to use a known method not explained here, such as a COG method, a wire bonding method or a TAB method.

It is possible to freely combine this Embodiment with Embodiment 1 or 2.

Embodiment 4

An example of forming a pixel electrode which has unevenness of the surface without the number of process steps is described in this Embodiment. Note that only the points that differ from Embodiment 1 are explained for the simplification.

This Embodiment is an example of forming the first conductive layers 1101a and 1101b and a lamination 1103 comprising an amorphous semiconductor film with a different pitch from the first conductive layers 1101a and 1101b, an n-type semiconductor film containing an impurity element which imparts n-type and a second conductive layer after forming an insulating film 1102, as shown in FIG. 11.

The first conductive layers 1101a and 1101b can be formed by altering the mask of Embodiment 1, without increasing the number of masks. The first conductive layers 1101a and 1101b are formed by changing the first mask at the formation of the gate electrode 1100 of Embodiment 1. Further, the lamination 1103 is formed by changing the second mask of Embodiment 1.

By doing so, the unevenness formed on the surface of the pixel electrode 1104 can be differed in their size and at the same time the arrangement of the uneven portions can be made random without increasing the number of process steps, thereby enabling more dispersion of the reflection of light.

Note that this Embodiment can be freely combined with any of the Embodiments 1 to 3.

Embodiment 5

This Embodiment shows an example of forming a pixel electrode which has unevenness of the surface, without increasing the number of process steps. Note that only the points that differ from Embodiment 1 are explained for the simplification.

This Embodiment is an example of forming a convex portions 1201 and 1202 which have different heights as shown in FIG. 12.

The convex portions 1201 and 1202 can be formed by changing the mask of Embodiment 7 without increasing the number of masks. In this Embodiment the height of the convex portion 1202 is lower than that of the convex portion 1201 by the amount of film thickness of the first conductive layer, because the mask which does not form the first conductive layer on the convex portion 1202 is used in the patterning of the gate electrodes as shown in FIG. 12. The mask used for the patterning of the first conductive layer used in Embodiment 7 is changed in this Embodiment to form 2 kinds of convex portions 1201 and 1202 that have different heights, in random in the area which becomes a display region.

Accordingly the difference in heights of the convex and concave formed on the surface of the pixel electrode 1200 can be made large without increasing the number of process steps, and further the reflection light can be scattered.

Note this Embodiment can be freely combined with any one of Embodiments 1 to 4.

Embodiment 6

In this Embodiment, an example of forming a protecting film is shown in FIG. 13. Note that this Embodiment is identical to Embodiment 1 through the state of FIG. 3B, and therefore only points of difference are explained.

After first forming through the state of FIG. 3B in accordance with Embodiment 1, a thin inorganic insulating film is formed on the entire surface. An inorganic insulating film formed by using plasma CVD or sputtering such as a silicon oxide film, a silicon nitride film, a silicon oxynitride film, or a tantalum oxide film is used as the thin inorganic insulating film, and a single layer or a lamination structure made from these materials may be formed.

A forth photolithography process is performed next, forming a resist mask, and unnecessary portions are removed by etching, forming an insulating film 1300 in the pixel TFT portion. The inorganic insulating film 1300 functions as a passivation film. Further, the thin inorganic insulating film 1300 is removed in the terminal portion by the fourth photolithography process, exposing the third conductive film, made from the conductive film, formed on the terminal 101a of the terminal portion.

The reverse stagger type n-channel TFT and the storage capacitor, protected by the inorganic insulating film, can thus be completed in this Embodiment by performing the photolithography process using four photomasks four times in total. By thus structuring the pixel portion by arranging these into a matrix state corresponding to each pixel, one substrate for manufacturing the active matrix electro-optical device can be made.

Note that it is possible to freely combine this Embodiment with any one of Embodiments 1 to 4.

Embodiment 7

In Embodiment 1 an example of forming an insulating film, an amorphous semiconductor film, an n-type semiconductor film containing an impurity element which imparts n-type conductivity, and a second conductive film by sputtering, but this Embodiment shows an example of using plasma CVD to form the films.

The insulating film, the amorphous semiconductor film, and the n-type semiconductor film containing an impurity element which imparts n-type conductivity are formed in this Embodiment by plasma CVD.

In this Embodiment, a silicon oxynitride film is used as the insulating film, and formed with a thickness of 150 nm by plasma CVD. Plasma CVD may be performed at this point with a power supply frequency of 13 to 70 MHZ, preferably between 27 and 60 MHZ. By using a power supply frequency of 27 to 60 MHZ, a dense insulating film can be formed, and the voltage resistance can be increased as a gate insulating film. Further, a silicon oxynitride film manufactured by adding $N_2O$ to $SiH_4$ and $NH_3$ has a reduction in fixed electric charge density, and therefore is a material which is preferable for this use. Of course, the gate insulating film is not limited to this type of silicon oxynitride film, and a single layer or a lamination structure using other insulating films such as s silicon oxide film, a silicon nitride film, or a tantalum oxide film may be formed. Further, a lamination structure of a silicon nitride film in a lower layer, and a silicon oxide film in an upper layer may be used.

For example, when using a silicon oxide film, it can be formed by plasma CVD using a mixture of tetraethyl orthosilicate (TEOS) and $O_2$, with the reaction pressure set to 40 Pa, a substrate temperature of 250 to 350° C., and discharge at a high frequency (13.56 MHZ) power density of 0.5 to 0.8 $W/cm^2$. Good characteristics as the gate insulating film can be obtained for the silicon oxide film thus formed by a subsequent thermal anneal at 300 to 400° C.

Further, a hydrogenated amorphous silicon (a-Si:H) film is typically formed with a thickness of 100 nm by plasma CVD as the amorphous semiconductor film. At this point, plasma CVD may be performed with a power supply frequency of 13 to 70 MHZ, preferably between 27 and 60 MHZ, in the plasma CVD apparatus. By using a power frequency of 27 to 60 MHZ, it becomes possible to increase the film deposition speed, and the deposited film is preferable because it becomes an a-Si film having a low defect density. In addition, it is also possible to apply a microcrystalline semiconductor film and a compound semiconductor film having an amorphous structure, such as an amorphous silicon germanium film, as the amorphous semiconductor film.

Further, if 100 to 100 kHz pulse modulation discharge is performed in the plasma CVD film deposition of the insulating film and the amorphous semiconductor film, then particle generation due to the plasma CVD gas phase reaction can be prevented, and pinhole generation in the formed film can also be prevented, and therefore is preferable.

Further, in this Embodiment an n-type semiconductor film, containing an impurity element which imparts n-type conductivity is formed with a thickness of 20 to 80 nm as a semiconductor film containing a single conductivity type impurity element. For example, an a-Si:H film containing an n-type impurity element may be formed, and in order to do so, phosphine ($PH_3$) is added at a 0.1 to 5% concentration to silane ($SiH_4$). Alternatively, a hydrogenated microcrystalline silicon film ($\mu c$-Si:H) may also be used as a substitute for the n-type semiconductor film 106, containing an impurity element which imparts n-type conductivity.

These films can be formed in succession by appropriately changing the reaction gas. Further, these films can be laminated successively without exposure to the atmosphere at this time by using the same reaction chamber or a plurality of reaction chambers in the plasma CVD apparatus. By thus depositing successively these films without exposing the films to the atmosphere, the mixing in of impurities into the amorphous semiconductor film can be prevented.

Note that it is possible to combine this Embodiment with any one of Embodiments 1 to 6.

Embodiment 8

Examples are shown in Embodiments 1 to 7 of laminating an insulating film, an amorphous semiconductor film, an n-type semiconductor film containing an impurity element which imparts n-type conductivity, and a second conductive film, in order and in succession. An example of an apparatus prepared with a plurality of chambers, and used for cases of performing this type of successive film deposition is shown in FIG. 14.

An outline of an apparatus (successive film deposition system), shown in this Embodiment, is shown in FIG. 14 as seen from above. Reference numerals 10 to 15 in FIG. 14 denote chambers having airtight characteristics. A vacuum evacuation pump and an inert gas introduction system are arranged in each of the chambers.

The chambers denoted by reference numerals 10 and 15 are load-lock chambers for bringing test pieces (processing substrates) 30 into the system. The chamber denoted by reference numeral 11 is a first chamber for deposition of the insulating film 102a. The chamber denoted by reference numeral 12 is a second chamber for deposition of the amorphous semiconductor film 103a. The chamber denoted by reference numeral 13 is a third chamber for deposition of the n-type semiconductor film 104a which imparts n-type conductivity. The chamber denoted by reference numeral 14 is a fourth chamber for deposition of the second conductive film 105a. Further, reference numeral 20 denotes a common chamber of the test pieces, arranged in common with respect to each chamber.

An example of operation is shown below.

After pulling an initial high vacuum state in all of the chambers at first, a purge state (normal pressure) is made by using an inert gas, nitrogen here. Furthermore, a state of closing all gate valves 22 to 27 is made.

First, a cassette 28 loaded with a multiple number of processing substrates is placed into the load-lock chamber 10. After the cassette is placed inside, a door of the load-lock chamber (not shown in the figure) is closed. In this state, the gate valve 22 is opened and one of the processing substrates 30 is removed from the cassette, and is taken out to the common chamber 20 by a robot arm 21. Position alignment is performed in the common chamber at this time. Note that a substrate on which the first conductive layers 101a to 101d are formed, obtained in accordance with Embodiment 1, is used for the substrate 30.

The gate valve 22 is then closed, and a gate valve 23 is opened next. The processing substrate 30 is then moved into the first chamber 11. Film deposition processing is performed within the first chamber at a temperature of 150 to 300° C., and the insulating film 102a is obtained. Note that a film such as a silicon nitride film, a silicon oxide film, a silicon oxynitride film, or a lamination film of these films, can be used as the insulating film. A single layer silicon nitride film is employed in this Embodiment, but a two-layer, three-layer, or higher layer lamination structure film may also be used. Note that a chamber capable of plasma CVD is used here, but a chamber which is capable of sputtering by use of a target may also be used.

After completing the deposition of the insulating film, the processing substrate is pulled out into the common chamber by the robot arm, and is then transported to the second chamber 12. Film deposition is performed within the second chamber at a temperature of 150 to 300° C., similar to that of the first chamber, and the amorphous semiconductor film 103a is obtained by plasma CVD. Note that a film such as a microcrystalline semiconductor film, an amorphous germanium film, an amorphous silicon germanium film, or a lamination film of these films can be used as the amorphous semiconductor film. Further, a heat treatment process for reducing the concentration of hydrogen may be omitted with a formation temperature of 350 to 500° C. for the amorphous semiconductor film. Note that a chamber capable of plasma CVD is used here, but a chamber which is capable of sputtering by use of a target may also be used.

After completing deposition of the amorphous semiconductor film, the processing substrate is pulled out into the common chamber and then transported to the third chamber 13. Film deposition process is performed within the third chamber at a temperature of 150 to 300° C., similar to that of the second chamber, and the n-type semiconductor film 104a, containing an impurity element which imparts n-type conductivity (P or As), is obtained by plasma CVD. Note that a chamber capable of plasma CVD is used here, but a chamber which is capable of sputtering by use of a target may also be used.

After completing deposition of the n-type semiconductor film containing an impurity element which imparts n-type conductivity, the processing substrate is pulled out into the common chamber, and then is transported to the fourth chamber 14. The second conductive film 105a is obtained within the fourth chamber by sputtering using a metallic target.

The processed substrate, on which four layers have thus been formed in succession, is then transported to the load-lock chamber 15 by the robot arm, and is contained in a cassette 29.

Note that the apparatus shown in FIG. 14 is only one example. Further, it is possible to freely combine this Embodiment with any one of Embodiments 1 to 7.

Embodiment 9

Embodiment 8 showed an example of laminating the films in succession by using a plurality of cambers, whereas the films are laminated successively by holding a high vacuum in a single chamber in this Embodiment by using an apparatus shown in FIG. 15.

An apparatus system shown in FIG. 15 is used in this Embodiment. In FIG. 15, the reference numeral 40 denotes a processing substrate; 50, a common chamber; 44 and 46, load-lock chambers; 45, a chamber; and 42 and 43, cassettes. In this Embodiment lamination is formed in a same chamber in order to prevent contamination generated in transporting the substrates.

This Embodiment can be freely combined with any one of Embodiments 1 to 7.

Note however when applying to the Embodiment 1, a plurality of targets are prepared in the chamber 45, so that the insulating film 102a, the amorphous semiconductor film 103a, the n-type semiconductor film 104a containing an impurity element which imparts n-type and the second conductive film 105a by switching the reactive gas in order.

Embodiment 10

Embodiment 1 showed an example of forming the n-type semiconductor film containing an impurity element which imparts n-type by sputtering, but this Embodiment shows an example of forming the film by plasma CVD. Note that since this Embodiment is identical to Embodiment 1 except for the process for forming the n-type semiconductor film containing an impurity element which imparts n-type, only the points that differ are described below.

The n-type semiconductor film containing an impurity element which imparts n-type can be obtained by using plasma CVD, and by adding phosphine ($PH_3$) in a concentration between 0.1 and 5% with respect to the silane ($SiH_4$) as the reaction gas.

Embodiment 11

While Embodiment 10 shows an example of forming the n-type semiconductor film containing an impurity element which imparts n-type by plasma CVD, this Embodiment shows an example of using a microcrystalline semiconductor film containing an impurity element which imparts n-type.

A microcrystalline silicon film can be obtained by setting the deposition temperature 80 to 300° C., preferably 140 to 200° C., using a reaction gas of mixed gas of silane gas diluted with hydrogen ($SiH_4$:$H_2$=1:10-100) and phosphine, setting the gas pressure at 0.1 to 10 Torr and setting the discharge power at 10 to 300 mW/cm². In addition, the film may be formed by adding phosphorus by plasma doping after depositing the microcrystalline silicon film.

Embodiment 12

A bottom gate type TFT formed by implementing any one of the above Embodiments 1 to 11 can be used in various electro-optical devices (such as an active matrix liquid crystal display device and an active matrix EC display device). Namely, the present invention can be implemented in all electronic appliance in which these electro-optical devices are built into a display portion.

The following can be given as such electronic appliance: a video camera, a digital camera, a head-mounted display (goggle type display), a car navigation system, a car stereo, a personal computer, and a portable information terminal (such as a mobile computer, a portable telephone or an electronic book). Examples of these are shown in FIGS. 16 and 17.

FIG. 16A is a personal computer, and it includes a main body 2001, an image input portion 2002, a display portion 2003, and a keyboard 2004, etc. The present invention can be applied to the display portion 2003.

FIG. 16B is a video camera, and it includes a main body 2101, a display portion 2102, an audio input portion 2103, operation switches 2104, a battery 2105, and an image receiving portion 2106, etc. The present invention can be applied to the display portion 2102.

FIG. 16C is a mobile computer, and it includes a main body 2201, a camera portion 2202, an image receiving portion 2203, operation switches 2204, and a display portion 2205, etc. The present invention can be applied to the display portion 2205.

FIG. 16D is a goggle type display, and it includes a main body 2301, a display portion 2302, an arm portion 2303, etc. The present invention can be applied to the display portion 2302.

FIG. 16E is a player that uses a recording medium on which a program is recorded (hereafter referred to as a recording medium), and the player includes a main body 2401, a display portion 2402, a speaker portion 2403, a recording medium 2404, and operation switches 2405, etc. Note that this player uses a recording medium such as a DVD (digital versatile disk) or a CD, and the appreciation of music, the appreciation of film, game playing and the Internet can be performed. The present invention can be applied to the display portion 2402.

FIG. 16F is a digital camera, and it includes a main body 2501, a display portion 2502, an eyepiece portion 2503, operation switches 2504, and an image receiving portion (not shown in the figure), etc. The present invention can be applied to the display portion 2502.

FIG. 17A is a portable telephone, and it includes a main body 2901, an audio output portion 2902, an audio input portion 2903, a display portion 2904, operation switches 2905, and an antenna 2906, etc. The present invention can be applied to the display portion 2904.

FIG. 17B is a portable book (electronic book), and it includes a main body 3001, display portions 3002 and 3003, a recording medium 3004, operation switches 3005, and an antenna 3006, etc. The present invention can be applied to the display portions 3002 and 3003.

FIG. 17C is a display, and it includes a main body 3101, a support stand 3102, and a display portion 3103, etc. The present invention can be applied to the display portion 3103. The display of the present invention is advantageous for a large size screen in particular, and is advantageous for a display equal to or greater than 10 inches (especially equal to or greater than 30 inches) in the opposite angle.

The applicable range of the present invention is thus extremely wide, and it is possible to apply the present invention to electronic equipment in all fields. Further, the electronic equipment of this embodiment can be realized by using a constitution of any combination of embodiments 1 to 11.

What is claimed is:

1. A display device comprising:
   a substrate;
   a thin film transistor formed over the substrate;
   a pixel electrode formed over the substrate and electrically connected to the thin film transistor; and
   a plurality of convex portions located between the substrate and the pixel electrode wherein a surface of the pixel electrode is uneven due to the existence of the plurality of convex portions,
   wherein at least one of the plurality of convex portions has a different height from at least another one of the plurality of convex portions, and
   wherein at least one of the plurality of convex portions includes at least one layer which is simultaneously formed as a layer which constitutes the thin film transistor.

2. The display device according to claim 1 wherein the surface of the pixel electrode is reflective.

3. The display device according to claim 1 wherein a radius of curvature r of at least one of the plurality of convex portions is from 0.1 µm to 4 µm.

4. The display device according to claim 1 wherein the pixel electrode comprises a material selected from the group consisting of Al and Ag.

5. The display device according to claim 1 wherein the thin film transistor has a gate electrode comprising a material selected from the group consisting of Al, Cu, Ti, Mo, W, Ta, Nd, Cr and an alloy thereof.

6. The display device according to claim 1 wherein the thin film transistor comprises a gate electrode, a gate insulating film formed over the gate electrode, a semiconductor layer formed over the gate electrode with the gate insulating film interposed therebetween, and source and drain regions formed on the semiconductor layer.

7. A display device comprising:
   a substrate;
   a thin film transistor formed over the substrate, the thin film transistor comprising
   a gate electrode, a gate insulating film formed over the gate electrode, a semiconductor layer formed over the gate electrode with the gate insulating film interposed therebetween, and source and drain regions formed on the semiconductor layer;
   a pixel electrode formed over the substrate and electrically connected to one of the source and drain regions;
   a plurality of convex portions disposed between the pixel electrode and the substrate wherein a surface of the pixel electrode is uneven due to the existence of the plurality of convex portions, each of the plurality of convex portions including a layer which is formed of a same layer as at least one of the gate electrode, the gate insulating film and the semiconductor layer,
   wherein at least one of the plurality of convex portions has a different height from at least another one of the plurality of convex portions.

8. The display device according to claim 7 wherein the surface of the pixel electrode is reflective.

9. The display device according to claim 7 wherein a radius of curvature r of at least one of the plurality of convex portions is from 0.1 µm to 4 µm.

10. The display device according to claim 7, wherein the pixel electrode comprises a material selected from the group consisting of Al and Ag.

11. The display device according to claim 7 wherein the thin film transistor has a gate electrode comprising a material selected from the group consisting of Al, Cu, Ti, Mo, W, Ta, Nd, Cr and an alloy thereof.

12. A display device comprising:
    a substrate;
    a thin film transistor formed over the substrate;
    a pixel electrode formed over the substrate and electrically connected to the thin film transistor; and
    a plurality of convex portions located between the substrate and the pixel electrode wherein a surface of the pixel electrode is uneven due to the existence of the plurality of convex portions,
    wherein at least one of the plurality of convex portions has a different height from at least another one of the plurality of convex portions,
    the plurality of convex portions are arranged in random, and
    wherein at least one of the plurality of convex portions includes at least one layer which is simultaneously formed as a layer which constitutes the thin film transistor.

13. The display device according to claim 12 wherein the surface of the pixel electrode is reflective.

14. The display device according to claim 12 wherein a radius of curvature r of at least one of the plurality of convex portions is from 0.1 µm to 4 µm.

15. The display device according to claim 12 wherein the pixel electrode comprises a material selected from the group consisting of Al and Ag.

16. The display device according to claim 12 wherein the thin film transistor has a gate electrode comprising a material selected from the group consisting of Al, Cu, Ti, Mo, W, Ta, Nd, Cr and an alloy thereof.

17. The display device according to claim 12 wherein the thin film transistor comprises a gate electrode, a gate insulating film formed over the gate electrode, a semiconductor layer formed over the gate electrode with the gate insulating film interposed therebetween, and source and drain regions formed on the semiconductor layer.

18. A display device comprising:
    a substrate;
    a thin film transistor formed over the substrate;
    a pixel electrode formed over the substrate and electrically connected to the thin film transistor;
    an insulating film comprising an organic resin formed between the substrate and the pixel electrode wherein a surface of the insulating film has a plurality of convex portions and a surface of the pixel electrode is uneven due to the existence of the plurality of convex portions,
    wherein at least one of the plurality of convex portions has a different height from at least another one of the plurality of convex portions, and
    wherein at least one of the plurality of convex portions is formed on a layer which is simultaneously formed as a layer which constitutes the thin film transistor.

19. The display device according to claim 18 wherein the surface of the pixel electrode is reflective.

20. The display device according to claim 18 wherein the pixel electrode comprises a material selected from the group consisting of Al and Ag.

21. The display device according to claim 18 wherein the thin film transistor has a gate electrode comprising a material selected from the group consisting of Al, Cu, Ti, Mo, W, Ta, Nd, Cr and an alloy thereof.

22. The display device according to claim 18 wherein the thin film transistor comprises a gate electrode, a gate insulating film formed over the gate electrode, a semiconductor layer formed over the gate electrode with the gate insulating film interposed therebetween, and source and drain regions formed on the semiconductor layer.

23. A display device comprising:
a substrate;
a thin film transistor formed over the substrate;
a pixel electrode formed over the substrate and electrically connected to the thin film transistor;
an insulating film comprising an organic resin formed between the substrate and the pixel electrode wherein a surface of the insulating film has a plurality of convex portions and a surface of the pixel electrode is uneven due to the existence of the plurality of convex portions,
wherein at least one of the plurality of convex portions has a different height from at least another one of the plurality of convex portions, and the plurality of convex portions are arranged in random, and
wherein at least one of the plurality of convex portions is formed on a layer which is simultaneously formed as a layer which constitutes the thin film transistor.

24. The display device according to claim 23 wherein the surface of the pixel electrode is reflective.

25. The display device according to claim 23 wherein the pixel electrode comprises a material selected from the group consisting of Al and Ag.

26. The display device according to claim 23 wherein the thin film transistor has a gate electrode comprising a material selected from the group consisting of Al, Cu, Ti, Mo, W, Ta, Nd, Cr and an alloy thereof.

27. The display device according to claim 23 wherein the thin film transistor comprises a gate electrode, a gate insulating film formed over the gate electrode, a semiconductor layer formed over the gate electrode with the gate insulating film interposed therebetween, and source and drain regions formed on the semiconductor layer.

* * * * *

UNITED STATES PATENT AND TRADEMARK OFFICE
CERTIFICATE OF CORRECTION

| | |
|---|---|
| PATENT NO. | : 7,323,715 B2 |
| APPLICATION NO. | : 11/514274 |
| DATED | : January 29, 2008 |
| INVENTOR(S) | : Shunpei Yamazaki |

It is certified that error appears in the above-identified patent and that said Letters Patent is hereby corrected as shown below:

At column 3, line 17, "and a semiconductor" should be -- and a conducting --.

Signed and Sealed this
Fourteenth Day of June, 2011

David J. Kappos
*Director of the United States Patent and Trademark Office*